(12) United States Patent
Imaizumi et al.

(10) Patent No.: US 7,304,370 B2
(45) Date of Patent: Dec. 4, 2007

(54) ELECTRONIC DEVICE HAVING WIRING SUBSTRATE AND LEAD FRAME

(75) Inventors: Norihisa Imaizumi, Hoi-gun (JP); Yuuki Sanada, Nukata-gun (JP); Takeshi Ishikawa, Nishikasugai-gun (JP)

(73) Assignee: DENSO CORPORATION, Kariya (JP)

( * ) Notice: Subject to any disclaimer, the term of this patent is extended or adjusted under 35 U.S.C. 154(b) by 388 days.

(21) Appl. No.: 11/034,139

(22) Filed: Jan. 13, 2005

(65) Prior Publication Data

US 2005/0151229 A1    Jul. 14, 2005

(30) Foreign Application Priority Data

Jan. 14, 2004  (JP)  ............................. 2004-006684
Oct. 15, 2004  (JP)  ............................. 2004-301406

(51) Int. Cl.
*H01L 23/495*  (2006.01)
*H01L 23/02*   (2006.01)

(52) U.S. Cl. ............................. 257/666; 257/E23.052; 257/686

(58) Field of Classification Search ................ 257/666, 257/686
See application file for complete search history.

(56) References Cited

U.S. PATENT DOCUMENTS 5,563,442 A * 10/1996 Mahulikar et al. .......... 257/666
5,780,926 A *  7/1998 Seo .............................. 257/676
6,316,825 B1* 11/2001 Park et al. ................... 257/686
6,545,345 B1*  4/2003 Glenn et al. ................. 257/676
6,559,525 B2*  5/2003 Huang ......................... 257/675
2005/0189640 A1*  9/2005 Grundy et al. .............. 257/686

FOREIGN PATENT DOCUMENTS

| JP | A-4-3453 | 1/1992 |
| JP | A-5-326817 | 12/1993 |
| JP | A-6-334059 | 12/1994 |
| JP | A-8-213531 | 8/1996 |
| JP | A-2000-307027 | 11/2000 |
| JP | A-2001-68582 | 3/2001 |
| JP | A-2001-210736 | 8/2001 |

* cited by examiner

*Primary Examiner*—David A. Zarneke
(74) *Attorney, Agent, or Firm*—Posz Law Group, PLC

(57) ABSTRACT

An electronic device includes: a first substrate and a second substrate; a lead frame disposed between the first and the second substrates for electrically connecting therebetween; and a first groove and a second groove disposed on the first and the second substrates, respectively. The first and the second grooves correspond to a connection portion between the first and the second substrates and the lead frame. The lead frame is connected to the first and the second substrates in such a manner that one end of the lead frame is engaged in both of the first and the second grooves through a conductive bonding material.

5 Claims, 17 Drawing Sheets

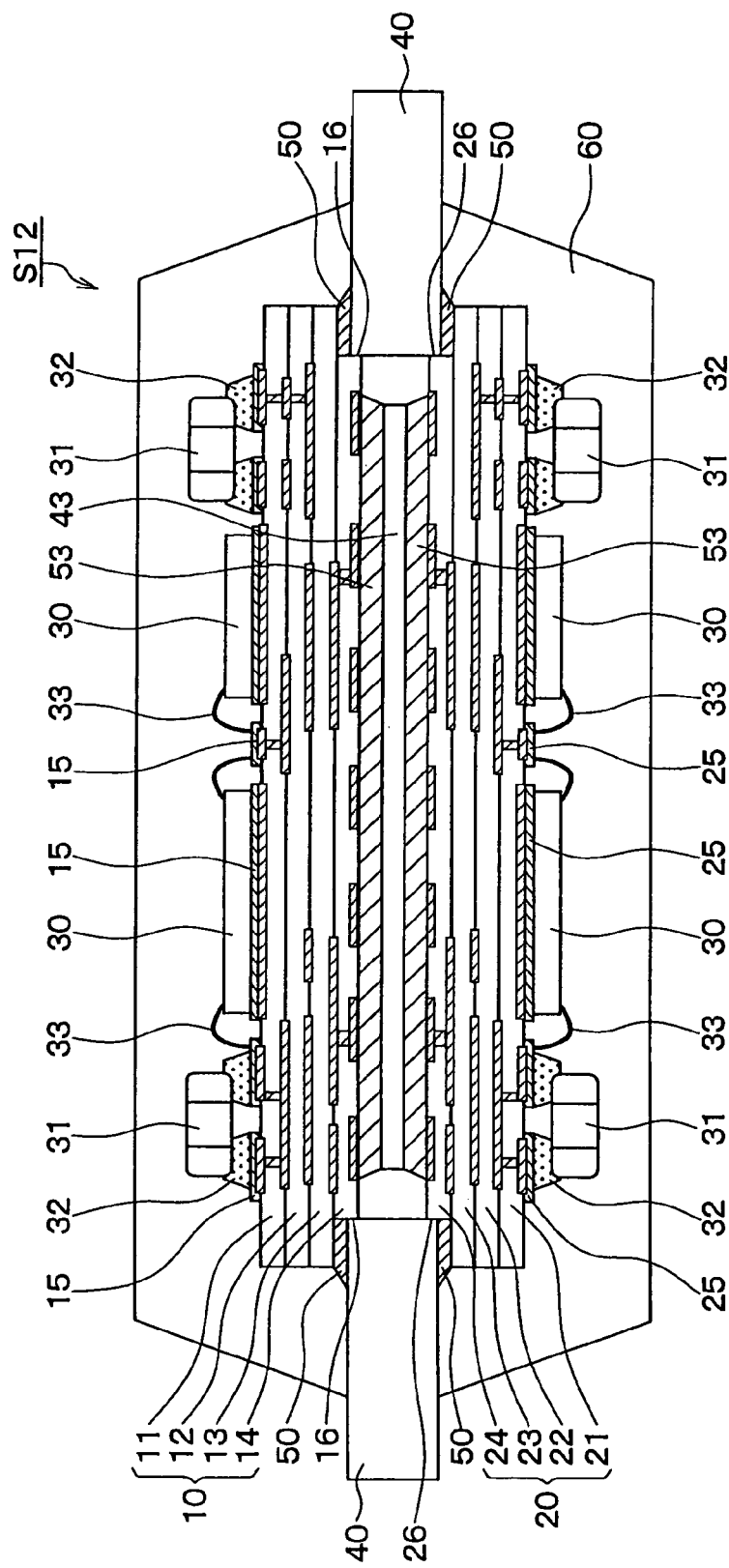

ELECTRONIC DEVICE HAVING WIRING SUBSTRATE AND LEAD FRAME

CROSS REFERENCE TO RELATED APPLICATIONS

This application is based on Japanese Patent Applications No. 2004-6684 filed on Jan. 14, 2004, and No. 2004-301406 filed on Oct. 15, 2004, the disclosures of which are incorporated herein by reference.

FIELD OF THE INVENTION

The present invention relates to an electronic device having a wiring substrate and a lead frame.

BACKGROUND OF THE INVENTION

Wire bonding is known as a conventional technique for connecting a wiring substrate and lead terminals electrically with each other. According to this conventional technique, a wiring substrate and lead terminals are connected together through wires, but there arises the problem that an increase of size results because it is necessary to provide a wire stretching area.

For solving this problem there has been proposed a method wherein a wiring substrate and lead terminals are connected together directly through a conductive bonding material. However, in the course of mounting parts onto the wiring substrate or in a resin molding process, a stress may be imposed on the bonded portion, causing a crack or the like in the bonding portion.

As a countermeasure there has heretofore been proposed a method wherein a wiring substrate and lead terminals are connected together directly through a conductive bonding material and thereafter a reinforcing resin is applied to the connected, or bonded, portions. This method is disclosed in, for example, Japanese Patent Application Publication No. 2001-210736.

There also has been proposed a method wherein a wiring substrate and lead terminals are connected together directly through a conductive bonding material and thereafter the fixed portions of the lead terminals are reinforced using an insulating tape. This method is disclosed in, for example, Japanese Patent Application Publication No. 2001-68582.

However, as mentioned above, according to the method wherein a wiring substrate and lead terminals are directly connected together through a conductive bonding material and thereafter the connected portions are reinforced using resin or an insulating tape, it is necessary to provide a process for disposing the resin or the insulating tape, thus resulting in an increase in the number of processes in the connection between the wiring substrate and the lead terminals.

SUMMARY OF THE INVENTION

In view of the above-described problem, it is an object of the present invention to provide an electronic device including a wiring substrate and a lead terminal bonded together through a conductive connecting material. The wiring substrate and the lead terminal are bonded with high strength without increasing the number of manufacturing processes. Further, the device has a three-dimensional layout so that the dimensions of the device are reduced.

An electronic device includes: a first substrate and a second substrate, which are laminated each other; a lead frame disposed between the first and the second substrates for electrically connecting therebetween; and a first groove and a second groove disposed on the first and the second substrates, respectively. The first and the second grooves correspond to a connection portion between the first and the second substrates and the lead frame. The lead frame is connected to the first and the second substrates in such a manner that one end of the lead frame is engaged in both of the first and the second grooves through a conductive bonding material.

In the above device, the lead frame is connected and engaged in both grooves of the first and the second substrates. Therefore, the lead frame is bonded to the first and the second substrates strongly, compared with a conventional device. Further, the groves are formed together with manufacturing the first and the second substrates. Therefore, the number of the manufacturing process of the device is not increased.

Further, the first and the second substrates are laminated each other, and the lead frame is electrically connected to the first and the second substrates. Therefore, multiple electronic parts can be mounted on both of the first and the second substrates so that the device has a three-dimensional layout. Thus, the dimensions of the device are reduced.

Preferably, the first and the second substrates are laminated substrates having a plurality of layers. One of the layers in the first substrate is shorter than the other layers so that the first grooves is provided, the one being disposed utmost outside of the first substrate. One of the layers in the second substrate is shorter than the other layers so that the second grooves is provided, the one being disposed utmost outside of the second substrate.

Preferably, the first and the second substrates are laminated substrates having a plurality of layers. One of the layers in the first substrate has a concavity so that the first grooves is provided, the one being disposed utmost outside of the first substrate, and one of the layers in the second substrate has a concavity so that the second grooves is provided, the one being disposed utmost outside of the second substrate.

Preferably, at least one of the first and the second substrates includes a terminal, and the one end of the lead frame includes an extension portion extending to the terminal of the first or the second substrate so that the extension portion electrically connects to the terminal. In this case, the connection resistance as a wiring resistance between the substrate and the lead frame can be reduced so that the electric connection performance therebetween is improved. Further, the frame can be grounded so that the noise generated in the device is reduced. Furthermore, the frame can provide a large current wiring so that a voltage drop in a wiring of the device and heat generated in the device are reduced.

Preferably, the device further includes: a heat radiation plate disposed between the first and the second substrates for radiating heat generated in the first and the second substrates. In this case, the heat radiation plate can improve the heat radiation performance of the first and the second substrates.

Further, an electronic device includes: a wiring substrate; a first electric part disposed on the wiring substrate; a lead frame connected to the wiring substrate through a conductive bonding material; and a second electric part. The wiring substrate includes a groove corresponding to a connection portion between the wiring substrate and the lead frame. The lead frame is connected to the substrate in such a manner that one end of the lead frame is engaged in the groove through the conductive bonding material. The lead frame has a surface, which is opposite to the connection portion. The second electric part is disposed on the surface of the lead frame. The second electric part electrically connects to the wiring substrate.

In the above device, the lead frame is connected and engaged in the groove of the wiring substrates. Therefore, the lead frame is bonded to the wiring substrate strongly, compared with a conventional device. Further, the grove is formed together with manufacturing the wiring substrates. Therefore, the number of the manufacturing process of the device is not increased. Further, multiple electronic parts such as the first and the second electric parts can be mounted on the wiring substrate and the lead frame so that the device has a three-dimensional layout. Thus, the dimensions of the device are reduced.

Preferably, the device further includes: a heat radiation plate disposed on the wiring substrate for radiating heat generated in the wiring substrate. The heat radiation plate is disposed on a connection portion side of the substrate.

Preferably, the device further includes: a heat sink disposed on a connection portion side of the substrate; and a resin mold. The lead frame and the heat sink are thermally connected. The resin mold seals the first and the second electric parts, the wiring substrate, the lead frame and the heat sink in such a manner that a part of the heat sink and a part of the lead frame are exposed from the resin mold. More preferably, the lead frame and the heat sink are integrated each other.

Further, an electronic device includes: a first wiring substrate; a first electric part disposed on the first wiring substrate; a casing including an inner surface facing the first wiring substrate; a second wiring substrate disposed on the inner surface of the casing; a second electric part disposed on the second wiring substrate; a lead frame connected to the first wiring substrate through a conductive bonding material; and a groove disposed on the first wiring substrate. The groove corresponds to a connection portion between the first wiring substrate and the lead frame. The lead frame is connected to the wiring substrate in such a manner that one end of the lead frame is engaged in the groove through the conductive bonding material. The lead frame is supported with the casing. The first wiring substrate is electrically connected to the second wiring substrate through the lead frame.

In the above device, the lead frame is bonded to the first wiring substrate strongly, compared with a conventional device. Further, the number of the manufacturing process of the device is not increased. Furthermore, the device has a three-dimensional layout so that the dimensions of the device are reduced.

Preferably, the device further includes: a heat sink disposed on the casing. The heat sink provides the inner surface.

Preferably, the casing is made of resin, and the lead frame is supported with the casing in such a manner that the lead frame is integrated with the casing by an insert molding method.

Further, an electronic device includes: a first substrate and a second substrate, which are laminated each other; and a lead frame disposed between the first and the second substrates for electrically connecting therebetween. The lead frame is connected to the first and the second substrates in such a manner that one end of the lead frame is engaged in a connection portion between the first and the second substrates through a conductive bonding material.

In the above device, the lead frame is bonded to the first and the second substrates strongly, compared with a conventional device. Further, the number of the manufacturing process of the device is not increased. Furthermore, the device has a three-dimensional layout so that the dimensions of the device are reduced.

BRIEF DESCRIPTION OF THE DRAWINGS

The above and other objects, features and advantages of the present invention will become more apparent from the following detailed description made with reference to the accompanying drawings. In the drawings:

FIG. 14 is a cross sectional view showing an electronic device according to a seventh embodiment of the present invention;

DETAILED DESCRIPTION OF THE PREFERRED EMBODIMENTS

First Embodiment

Figure 1:
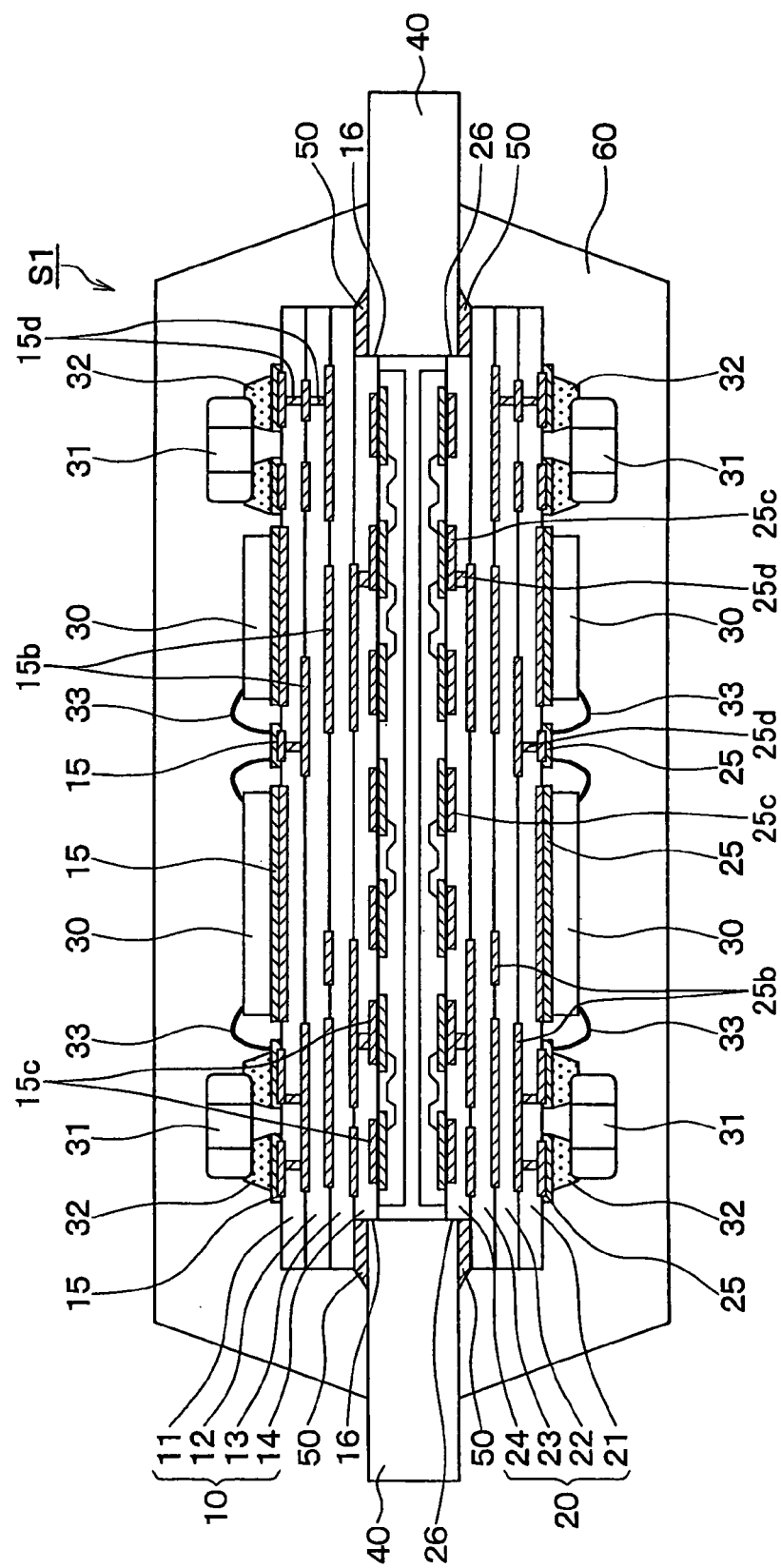
FIG. 1 is a cross sectional view showing an electronic device according to a first embodiment of the present invention.

FIG. 1 is a diagram showing a schematic sectional construction of an electronic device S1 according to a first embodiment of the present invention.

[Construction, Etc.]

The electronic device S1 shown in FIG. 1 is provided with a pair of stacked wiring substrates 10 and 20. In the same figure, the upper wiring substrate 10 and the lower wiring substrate 20 are here designated a first wiring substrate 10 and a second wiring substrate 20, respectively.

The wiring substrates 10 and 20 are, for example, ceramic substrates or printed substrates and may be single-layer substrates or laminated substrates (multi-layer substrates). In this embodiment, ceramic laminate substrates, which are generally known, are adopted as the first and second wiring substrates 10, 20.

The first and second wiring substrates 10, 20 as ceramic laminate substrates are constructed by plural ceramic (e.g., alumina) layers 11, 12, 13, 14 and plural like layers 21, 22, 23, 24, respectively.

Although in FIG. 1 the first and second wiring substrates 10, 20 comprise four ceramic layers 11 to 14 and 21 to 24, respectively, the number of layers is not limited to four insofar as the number of layers is two or more. Of course, five or more layers will do.

The first and second wiring substrates 10, 20 are stacked so that respective back surfaces confront each other. In FIG. 1, with respect to the first wiring substrate 10, the upper surface is a foreside surface and the lower surface is a backside surface, while with respect to the second wiring substrate 20, the lower surface is a foreside surface and the upper surface is a backside surface.

Surface wirings 15 and 25 are formed respectively on the surface of the first wiring substrate 10 and that of the second wiring substrate 20. Further, in FIG. 1, inner-layer wirings 15b, 25b and back wirings 15c, 25c are formed respectively in the interior and the back surface of each of the first and second wiring substrates 10, 20.

These wirings 15b, 15c, 25b, 25c are conductor patterns formed by printing, for example, conductor paste and provided on the surfaces, back surfaces, and between adjacent ones of the ceramic layers 11 to 14 and of the ceramic layers 21 to 24, in the wiring substrates 10 and 20. In the wiring substrates 10 and 20, the wirings 15b, 15c, 25b, 25c are mutually connected electrically through via holes 15d, 25d or the like formed in the ceramic layers 11 to 14 and 21 to 24.

As shown in FIG. 1, various electronic elements 30, 31 are mounted on the surfaces of the first and second wiring substrates 10, 20. In this embodiment, active elements 30 such as semiconductor devices and passive elements 31 such as resistors and capacitors are mounted on the surfaces of the wiring substrates 10 and 20.

The active elements 30 and the passive elements 31 are fixed onto the surface wirings 15 and 25 on the surfaces of the wiring substrates 10 and 20 through a bonding material 32 such as silver paste or solder. The active elements 30 are electrically connected to the surface wirings 15 and 25 through bonding wires 33.

Mounting parts such as thick film resistors are mounted on the back surfaces of the wiring substrates 10 and 20.

Circuits in the wiring substrates 10 and 20 are constructed by all of the elements 30 and 31 mounted on the surfaces of the wiring substrates 10 and 20, the mounting parts on the back surfaces of the elements 30 and 31, the surface wirings 15 and 25, the inner-layer wirings 15b, 25b, and the back wirings 15c, 25c.

Lead frames 40 as lead terminals are interposed between the first and second wiring substrates 10, 20 to provide an electric connection between both wiring substrates. The lead frames 40 are composed of multiple frames disposed in the vertical direction of the paper surface in FIG. 1.

As shown in FIG. 1, grooves 16 and 26 are formed in side end portions of the back surface of the first wiring substrate 10 and of the back surface of the second wiring substrate 20 at positions corresponding to the positions for connection with the lead frames 40.

Connecting end portions of the lead frames 40 for connection with the first and second wiring substrates 10, 20 are fitted in the grooves 16 and 26 through a conductive bonding material 50, whereby the lead frames 40 are bonded to the first and second wiring substrates 10, 20.

That is, the connecting end portions of the lead frames 40 are pinched by the first and second wiring substrates 10, 20, the grooves 16 and 26 are formed in the pinched positions, and the lead frames 40 are fitted in the grooves 16 and 26.

The grooves 16 and 26 are formed by partially removing the ceramic layers positioned on the back surfaces of the first and second wiring substrates 10, 20 out of the plural stacked ceramic layers 11 to 14 and 21 to 24 of both wiring substrates.

In the example shown in FIG. 1, the ceramic layers 14 and 24 positioned closest to the back surfaces of the wiring substrates 10 and 20 are partially removed from their side end portions to form cutout portions serving as the grooves 16 and 26.

In case of adopting such a construction using the grooves 16 and 26, for example the wirings formed in the ceramic layers 13 and 23 as the second layers from the back surfaces of the wiring substrates 10 and 20 are exposed into the grooves 16 and 26, serving as connecting electrodes for connection with the lead frames 40. The wirings as the connecting electrodes and the lead frames 40 are connected together electrically and mechanically through the conductive bonding material 50.

The conductive bonding material 50 is not specially limited insofar as it can properly connect the lead frames 40 with the wiring substrates 10 and 20 electrically and mechanically. For example, there may be used solder, silver paste, a conductive adhesive comprising resin and a conductive filler such as metal contained in the resin, or a brazing filler metal.

In the electronic device S1, as shown in FIG. 1, the first and second wiring substrates 10, 20, the elements 30, 31 and other mounting parts on the wiring substrates 10 and 20, and the connections between the wiring substrates 10, 20 and the lead frames 40, are enclosed and sealed with a molding resin 60.

[Manufacturing Method, Etc.]

A method for manufacturing the electronic device S1 of this embodiment will be described below with reference to FIGS. 2A to 2E. FIGS. 2A to 2E are process charts showing the manufacturing method, of which FIGS. 2A to 2D are schematic sectional views and FIG. 2E is an enlarged perspective view of connections between the wiring substrates 10, 20 and the lead frames 40.

The manufacturing method roughly comprises a process of forming grooves 16 and 26 in side end portions of the first and second wiring substrates 10, 20 at positions corresponding to the connections between the wiring substrates and the lead frames 40, a process of fitting the connecting end portions of the lead frames 40 for connection with the wiring substrates 10 and 20 into the first and second grooves 16, 26 through the conductive bonding material 50 to connect the lead frames 40 to the wiring substrates 10 and 20, and a resin sealing process.

Figure 2A:
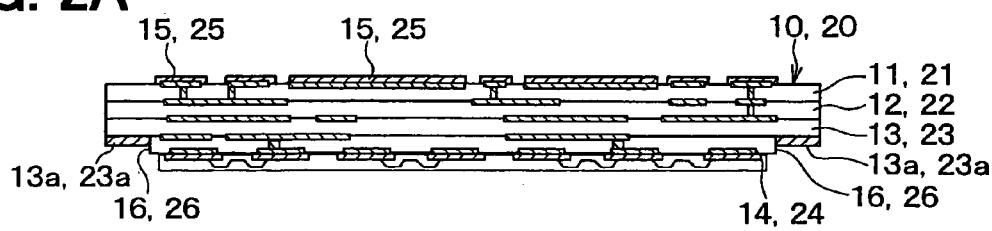
FIGS. 2A to 2E are cross sectional views explaining a method for manufacturing the device according to the first embodiment.

First, as shown in FIG. 2A, the foregoing via holes and conductor patterns serving as surface wirings 15, 25, innerlayer wirings 15b, 25b and back wirings 15c, 25c are formed in green sheets serving as ceramic layers 11 to 14 and 21 to 24. How to form them may be a conventional method for forming a laminate substrate.

Then, for forming cutout portions serving as grooves 16 and 26, the ceramic layers 14 and 24 formed on the back surfaces of the wiring substrates 10 and 20 are partially removed. In FIG. 2A, side end portions of one layers positioned closest to the back surfaces are partially cut off by means of a laser or a punch correspondingly to the example shown in FIG. 1.

Next, the green sheets are stacked and the resulting laminate is baked, whereby first and second wiring substrates 10, 20 having grooves 16 and 26 formed in side edge portions of the back surfaces are fabricated.

In the wiring substrates 10 and 20, where required, a plating treatment is applied to the surface and back wirings in order to ensure a high mountability of IC, etc., or thick film resistors for example are formed on the back surfaces by printing and baking. Further, if necessary, protection glass is formed, or laser trimming is performed for adjusting a resistance value.

In the example shown in FIG. 2A, wirings 13a and 23a which are formed on the ceramic layers 13 and 23 as the second layers from the back sides of the wiring substrates 10 and 20 are exposed into the grooves 16 and 26 as connecting electrodes for connection with the lead frames 40.

The cutting for the green sheets may be done up to a desired layer according to a required depth of the grooves 16 and 26. For example, it may be done for only the first layers from the back surfaces or up to the third layers.

Figure 2B:
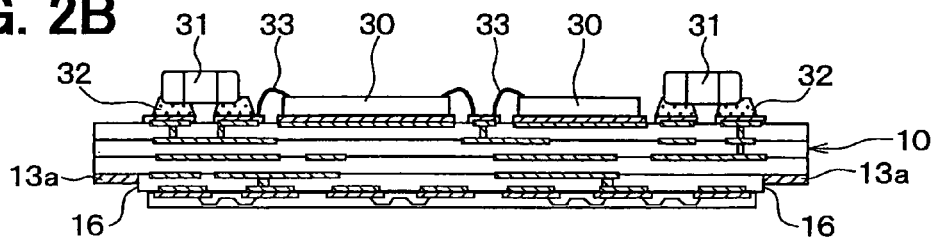

Then, as shown in FIG. 2B, electronic elements 30 and 31 are mounted on the surfaces of the wiring substrates 10 and 20. Although only the first wiring substrate 10 is represented in FIG. 2B, the state of mounting of the electronic elements 30 and 31 is the same as in the second wiring substrate 20.

In this process of mounting the electronic elements 30 and 31, the active elements 30 and passive elements 31 are mounted and fixed onto the surfaces of the wiring substrates 10 and 20 through a bonding material 32 such as silver paste or solder, and bonding wires 33 are formed on the active elements 33 by wire bonding to connect the active elements 30 and the wiring substrates 10, 20 electrically with each other.

Next, a process of connecting the lead frames 40 to the first and second wiring substrates 10, 20 is carried out.

Figure 2C:
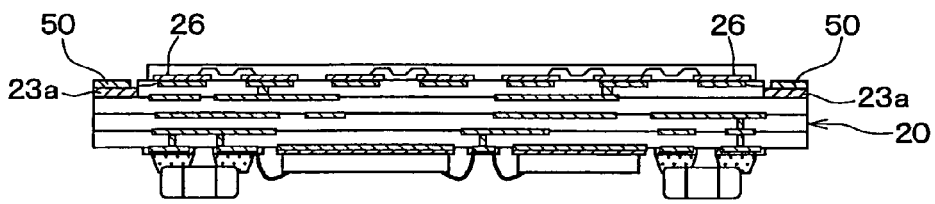
Figure 2D:
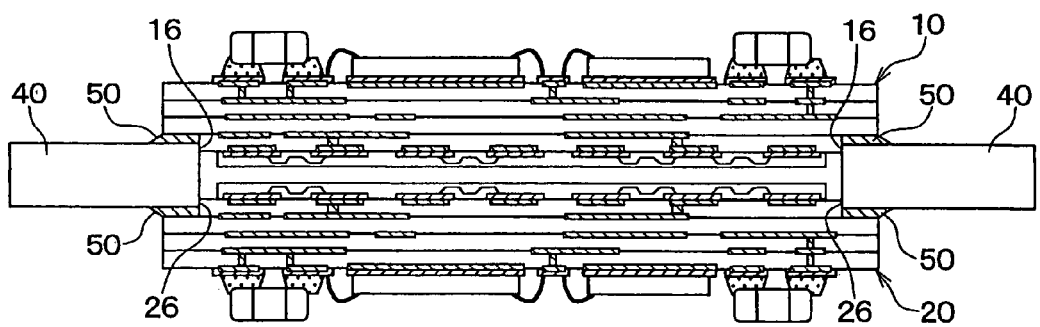
Figure 2E:
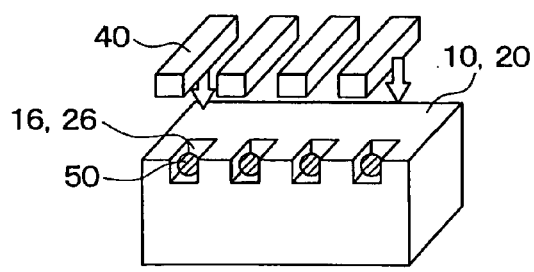

First, as shown in FIGS. 2C and 2E, a conductive bonding material 50 is disposed within the grooves 16 and 26 of the wiring substrates 10 and 20. Although the second wiring substrate 20 is represented in FIG. 2C, the state of disposition of the conductive bonding material 50 is the same as in the first wiring substrate 10.

The conductive bonding material 50 may be disposed on the lead frame 40 side. How to dispose the conductive bonding material 50 is not specially limited. For example, printing or dispensing may be adopted.

In case of disposing the conductive bonding material 50 by printing, it is preferable that the conducting material 50 be disposed on the lead frame 40 side. The reason is that, when printing is performed onto the wiring substrates 10 and 20 having such depressions as the grooves 16 and 26, there sometimes is a case where the conductive bonding material 50 does not smoothly get into the grooves 16 and 26.

Then, as shown in FIG. 2D, connecting end portions of the lead frames 40 for connection with the first and second wiring substrates 10 and 20 are fitted into the grooves 16 and 26 through the conductive bonding material 50 while being pinched by both wiring substrates 10, 20.

After the connecting end portions of the lead frames 40 for connection with the first and second wiring substrates 10, 20 are thus fitted into the grooves 16 and 26 through the conductive bonding material 50, the conductive bonding material 50 is cured, whereby the wiring substrates 10, 20 and the lead frames 40 are connected together electrically and mechanically.

Thereafter, a resin sealing process is carried out by a transfer molding method using a molding die. In the resin sealing process, the first and second wiring substrates 10, 20, the elements and mounting parts on the wiring substrates, and the connections between the wiring substrates 10, 20 and the lead frames 40, are sealed with a molding resin 60.

In this state, the individual lead frames 40 are integrally connected to frame portions through tiebars or the like. Therefore, the lead frames 40 are separated after the resin sealing with the molding resin 60. In this way the electronic device S1 is fabricated.

[Effect, Etc.]

In this embodiment there is provided the electronic device S1 including the first and second wiring substrates 10, 20 stacked one on the other and the lead frames 40 interposed between the first and second wiring substrates 10, 20 to provide an electric connection between both wiring substrates, wherein grooves 16 and 26 are formed in side end portions of the first and second wiring substrates 10, 20 at positions corresponding to connecting portions of the lead frames 40, and connecting end portions of the lead frames 40 for connection with the first and second wiring substrates 10, 20 are fitted into the grooves 16 and 26 through the conductive bonding material 50, whereby the wiring substrates 10, 20 and the lead frames 40 are connected together.

Since the lead frames 40 are connected to the first and second wiring substrates 10, 20 by being fitted in the grooves 16 and 26, the connection between the wiring substrates 10, 20 and the lead frames 40 can be made stronger than in the prior art.

Particularly, in this embodiment, since the connecting end portions of the lead frames 40 are pinched by the first and second wiring substrates 10, 20, the connection between the first and second wiring substrates 10, 20 and the lead frames 40 can be made stronger, in addition to the effect of the grooves 16 and 26.

Since the grooves 16 and 26 can be formed simultaneously with fabrication of the first and second wiring substrates 10, 20, as shown in the above manufacturing method, an increase in the number of processes does not occur in connecting the lead frames 40 to the first and second wiring substrates 10, 20.

Since the first and second wiring substrates 10, 20 are stacked one on the other and are electrically connected together through the lead frames 40, the electronic elements 30 and 31 can be arranged properly in a three-dimensional form on each of the first and second wiring substrates 10, 20.

Thus, according to this embodiment, in connecting the lead frames 40 and the wiring substrates 10, 20 with each other, not only the connection can be made strong without causing an increase in the number of processes, but also the electronic elements 30 and 31 can be arranged easily in a three-dimensional form, whereby it is possible to attain the reduction in size of the electronic device.

Moreover, since in this embodiment the lead frames 40 are directly connected to the wiring substrates 10 and 20, heat generated for example from the elements 30 and 31 mounted on the wiring substrates 10 and 20 can be radiated to the exterior through the lead frames 40.

In the example shown in FIG. 1, the first and second wiring substrates 10, 20 are laminate substrates of plural stacked layers 11 to 14 and 21 to 24, and the grooves 16 and 26 are formed by partial removal of the layers 14 and 24 positioned on the outer surface side out of the plural stacked layers 11 to 14 and 21 to 24.

However, as mentioned earlier, the wiring substrates 10 and 20 used in this embodiment may be single-layer substrates. Also in this case, grooves can be formed by partially cutting or pressing side end portions of the substrates.

Second Embodiment

Figure 3:
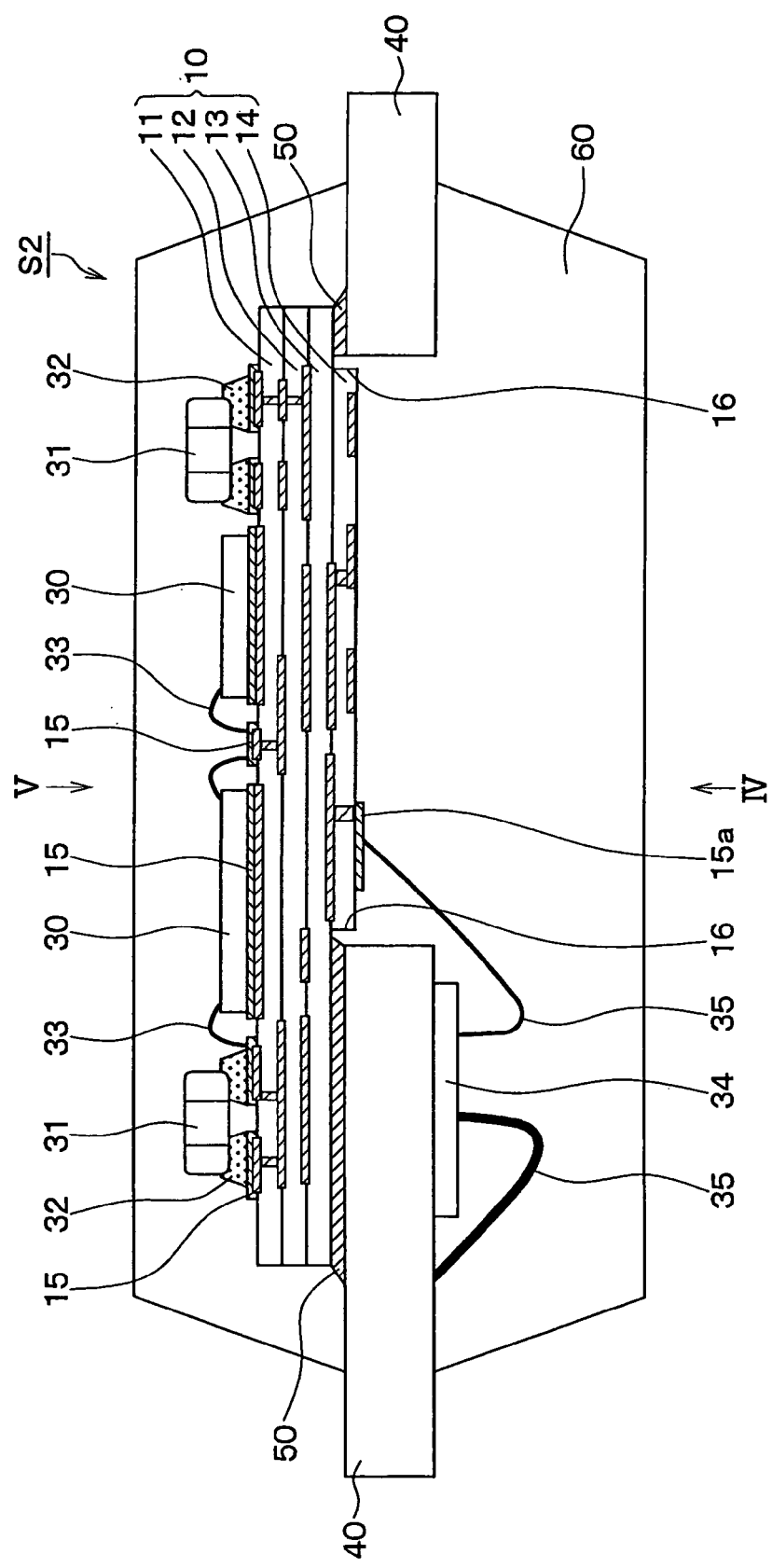
FIG. 3 is a cross sectional view showing an electronic device according to a second embodiment of the present invention.
Figure 4:
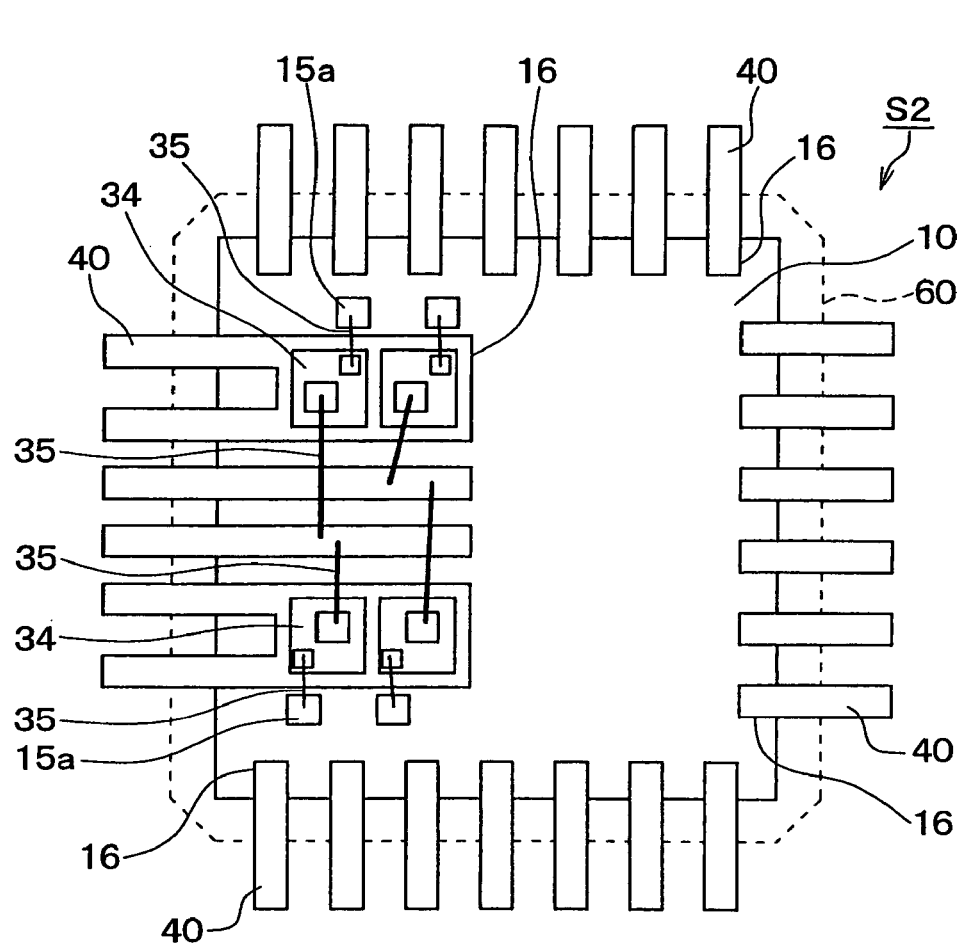
FIG. 4 is a plan view on arrow IV in FIG. 3.
Figure 5:
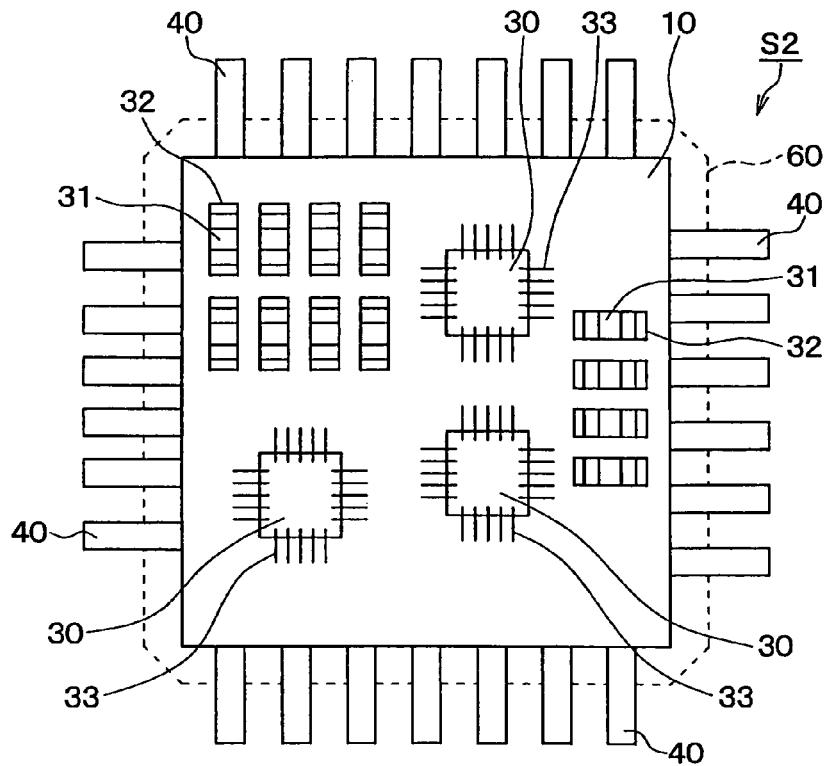
FIG. 5 is a plan view on arrow V in FIG. 3.

FIG. 3 is a diagram showing a schematic sectional construction of an electronic device S2 according to a second embodiment of the present invention, FIG. 4 is a schematic plan view of the electronic device S2 as seen in the direction of arrow IV located at a lower position in FIG. 3, and FIG. 5 is a schematic plan view of the electronic device S2 as seen in the direction of arrow V located at an upper position in FIG. 3. In FIGS. 4 and 5, the profile of the molding resin 60 is indicated with a broken line.

[Construction, Etc.]

In the electronic device S2 of this embodiment, the wiring substrate 10 is, for example, a ceramic substrate or a printed substrate. It may be a single-layer substrate or a laminated substrate (multi-layer substrate). In this embodiment, a ceramic laminate substrate, which is generally known, is adopted as the wiring substrate 10.

The wiring substrate 10 as a ceramic laminate substrate is constructed by plural ceramic (e.g., alumina) layers 11, 12, 13, and 14. In FIG. 3, an upper surface of the wiring substrate is a surface and a lower surface thereof is a back surface.

In the example shown in FIG. 3, the wiring substrate 10 comprises four ceramic layers 11 to 14, but the number of constituent layers is not specially limited insofar as it is two or more. Of course, five or more layers will do.

Surface wiring 15 is formed on the surface of the wiring substrate 10, while on the back surface of the wiring substrate 10 are formed back electrodes 15*a* as part of back wiring.

The inner-layer wiring 15*b* and back wiring 15*c* other than the back electrodes 15*a* are formed respectively in the interior and on the back surface of the wiring substrate 10.

As shown in FIGS. 3 and 5, first electronic elements 30 and 31 are mounted on the surface of the wiring substrate 10. In this embodiment, active elements 30 such as semiconductor devices and passive elements 31 such as resistors and capacitors are mounted on the surface of the wiring substrate 10.

The active elements 30 and the passive elements 31 are fixed onto the surface wiring 15 on the surface of the wiring substrate 10 through a bonding material 32 such as silver paste or solder. The active elements 30 are electrically connected to the surface wiring 15 through bonding wires 33.

Mounting parts, e.g., thick film resistors, are mounted on the back surface of the wiring substrate 10. A circuitry in the wiring substrate 10 is constructed by all of the first electronic elements 30 and 31 mounted on the surface of the wiring substrate 10, the mounting parts on the back surface of the same wiring substrate, and such wirings as the surface wiring 15, inner-layer wiring 15*b* and back wiring 15*c*.

In the wiring substrate 10 with the first electronic elements 30 and 31 thus mounted thereon, lead frames 40 as lead terminals are connected through a conductive bonding material 50 to side end portions of the back surface side of the substrate. The lead frames 40 are disposed in a plural number in the vertical direction of the paper surface.

As shown in FIG. 3, grooves 16 are formed in side end portions of the back surface of the wiring substrate 10 at positions corresponding to the positions for connection with the lead frames 40. Connecting end portions of the lead frames 40 for connection with the wiring substrate 10 are fitted in the grooves 16 through the conductive bonding material 50, whereby the lead frames 40 are bonded to the wiring substrate 10.

The grooves 16 are formed by partially removing the ceramic layer positioned on the back surface of the wiring substrate 10 out of the plural stacked ceramic layers 11 to 14.

In the example shown in FIG. 3, the ceramic layer 14 positioned closest to the back surface of the wiring substrate 10 is partially removed from its side end portions to form cutout portions serving as the grooves 16.

In case of adopting such a construction using the grooves 16, for example the wiring formed in the ceramic layer 13 as the second layer from the back surface of the wiring substrate 10 is exposed into the groove 16, serving as connecting electrodes for connection with the lead frames 40. The wiring as the connecting electrodes and the lead frames 40 are connected together electrically and mechanically through the conductive bonding material 50.

The conductive bonding material 50 is not specially limited insofar as it can properly connect the lead frames 40 with the wiring substrate 10 electrically and mechanically. For example there may be used solder, silver paste, a conductive adhesive comprising resin and a conductive filler such as metal contained in the resin, or a brazing filler metal.

Second electronic elements 34 are connected to the lead frames 40 on the side opposite to the side where the lead frames are connected to the wiring substrate 10. As the second electronic elements 34 there may be adopted, for example, power devices through which a large current, such as MOSFET or IGBT (insulated gate bipolar transistor).

The second electronic elements 34 and the wiring substrate 10 are electrically connected with each other. In this embodiment, as shown in FIGS. 3 and 4, the second electronic elements 34 and the back electrodes 15*a* of the wiring substrate 10 are electrically connected with each other through bonding wires 35.

Likewise, as shown in FIG. 4, the lead frames 40 with the second electronic elements 34 mounted thereon and the lead frames 40 located in the vicinity thereof are electrically connected with each other through bonding wires 35.

The bonding wires 35 for connection between the lead frames 34 are thicker than the bonding wires 35 for connection between the second electronic elements 34 and the wiring substrate 10 and the bonding wires 33 used in the wiring substrate 10.

In the electronic device S2 of this embodiment, as shown in FIGS. 3 to 5, the wiring substrate 10, the connections between the wiring substrate 10 and the lead frames 40, the first electronic elements 30 and 31 on the wiring substrate 10, the second electronic elements 34 on the lead frames 40, and the bonding wires 35, are enclosed and sealed with a molding resin 60.

The electronic device S2 is mounted, for example, on an automobile and is applicable as an automobile motor controller. In this case, there may be adopted such a construction as shown in FIG. 6 in which a control section K1 is disposed on the wiring substrate 10 side and a power section K2 is disposed on the lead frame 40 side.

Figure 6:
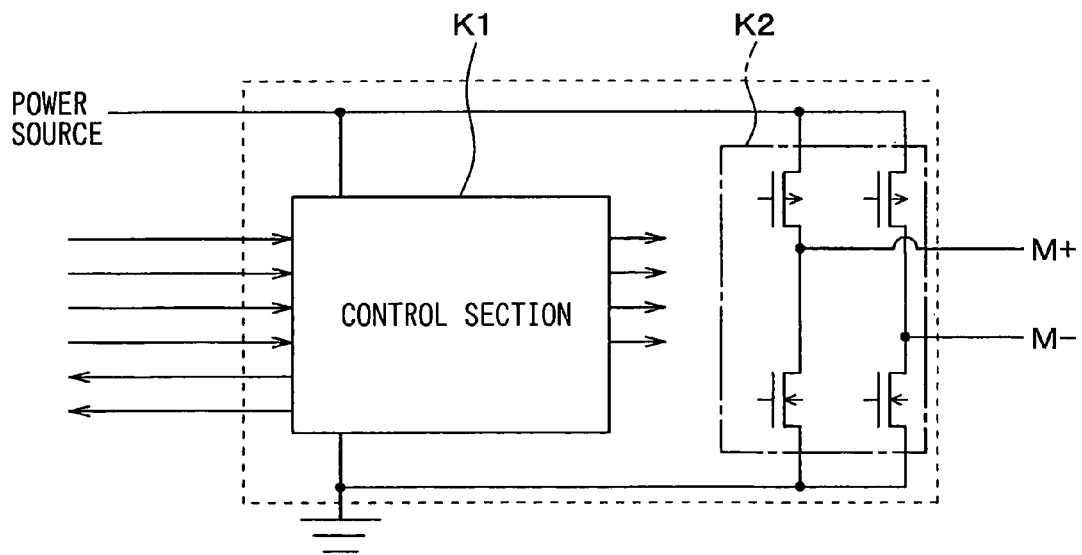
FIG. 6 is a block diagram showing a circuit system of the electronic device according to the second embodiment.

FIG. 6 is a block diagram showing an example of a circuit system in the electronic device S2 of this embodiment. The control section K1 is constructed by a microcomputer and drive element comprising the first electronic elements 30 and 31 which are mounted on the wiring substrate 10.

On the other hand, the power section K2 is an output circuit constructed by the second electronic elements 34 comprising power transistors which are mounted on the lead frames 40, and is connected to the foregoing motor through terminals M+ and M−.

For example, the control section K1 receives a signal from an ECU mounted on an automobile and controls the power section K2 through the microcomputer and drive element, whereby the motor of the automobile is controlled.

[Manufacturing Method, Etc.]

The following description is now provided about a method for manufacturing the electronic device S2 according to this embodiment.

The manufacturing method roughly comprises a process of forming grooves 16 in side end portions of the wiring substrate 10 at positions corresponding to the connections between the wiring substrate and the lead frames 40, a process of fitting the connecting end portions of the lead frames 40 for connection with the wiring substrate 10 into the grooves 16 through the conductive bonding material 50 to connect the lead frames 40 to the wiring substrate 10, and a resin sealing process.

First, the foregoing via holes 15*d* and conductor patterns serving as surface wiring 15, inner-layer wiring 15*b* and back wiring 15*c* including back electrodes 15*a* are formed in green sheets serving as ceramic layers 11 to 14. How to form them may be a conventional method for forming a laminate substrate.

Then, for forming cutout portions serving as grooves 16, the ceramic layer 14 formed on the back surface of the wiring substrate 10 is partially removed. In the example shown in FIG. 3, side end portions of one layer 14 positioned closest to the back surface are partially cut off by means of a laser or a punch.

Next, the green sheets are stacked and the resulting laminate is baked, whereby the wiring substrate 10 having grooves formed in side end portions of the back surface is fabricated.

In the wiring substrate 10, where required, a plating treatment may be applied to the surface and back wirings in order to ensure a high mountability of IC, etc., or thick film resistors for example are formed on the back surface by printing and baking. Further, if necessary, protection glass is formed, or laser trimming is performed for adjusting a resistance value.

The cutting for the green sheets may be done up to a desired layer according to a required depth of the grooves 16. For example, it may be done for only the first layer from the back surface or up to the third layer.

Then, first electronic elements 30 and 31 are mounted on the surface of the wiring substrate 10. In this process of mounting the first electronic elements 30 and 31, the electronic elements 30 and 31 as the active and passive elements respectively are mounted and fixed onto the surface of the wiring substrate 10 through a bonding material 32 such as silver paste or solder, and bonding wires 33 are formed on the active elements 30 by wire bonding to connect the active elements 30 and the wiring substrate 10 electrically with each other.

Next, a process of connecting the lead frames 40 to the wiring substrate 10 and mounting the second electronic elements 34 onto the lead frames 40 is carried out. The mounting and fixing of the second electronic elements 34 to the lead frames 40 can be done using a bonding material such as silver paste or solder and it is optional whether the said mounting and fixing are to be performed before or after the bonding between the wiring substrate 10 and the lead frames 40.

In connecting the wiring substrate 10 and the lead frames 40 with each other, first a conductive bonding material 50 is disposed within the grooves 16 of the wiring substrate 10. The conductive bonding material 50 may be disposed on the lead frame 40 side. How to dispose the conductive bonding material 50 is not specially limited. For example, printing or dispensing may be adopted.

In case of disposing the conductive material 50 by printing, it is preferable that the conductive bonding material 50 be disposed on the lead frame 40 side. The reason is that, when printing is performed onto the wiring substrate 10 having such depressions as the grooves 16, there sometimes is a case where the conductive bonding material 50 does not smoothly get into the grooves 16.

Then, connecting end portions of the lead frames 40 for connection with the wiring substrate 10 are fitted into the grooves 16 through the conductive bonding material 50. Thereafter, the conductive bonding material 50 is cured, whereby the wiring substrate 10 and the lead frames 40 are connected together electrically and mechanically.

Subsequently, a resin sealing process is carried out by a transfer molding method using a molding die. In the resin sealing process, the wiring substrate 10, the connections between the wiring substrate 10 and the lead frames 40, the first electronic elements 30 and 31 on the wiring substrate 10, the second electronic elements 34 on the lead frames 40, and the bonding wires 35, are sealed with a molding resin 60.

In this state, the individual lead frames 40 are integrally connected to frame portions through tiebars or the like. Therefore, the lead frames 40 are separated after the resin sealing with the molding resin 60. In this way the electronic device S2 is fabricated.

[Effect, Etc.]

In this embodiment there is provided the electronic device S2 including the wiring substrate 10 with the first electronic elements 30 and 31 mounted thereon and the lead frames 40 bonded to the wiring substrate 10 through the conductive bonding material 50, wherein grooves 16 are formed in side end portions of the wiring substrate 10 at positions corresponding to connecting portions of the lead frames 40, and connecting end portions of the lead frames 40 for connection with the wiring substrate 10 are fitted into the grooves 16 through the conductive bonding material 50, whereby the wiring substrate 10 and the lead frames 40 are connected together, further, the second electronic elements 34 are mounted on the lead frames 40 on the side opposite to the side where the lead frames are connected to the wiring substrate 10, the second electronic elements 34 being electrically connected to the wiring substrate 10.

Since the lead frames 40 are connected to the wiring substrate 10 by being fitted in the grooves 16, the connection between the wiring substrate 10 and the lead frames 40 can be made stronger than in the prior art.

Since the grooves 16 can be formed simultaneously with fabrication of the wiring substrate 10, an increase in the number of processes does not occur in connecting the lead frames 40 to the wiring substrate 10.

Since the first electronic elements 30 and 31 are mounted on the surface of the wiring substrate 10 and the second electronic elements 34 are mounted on the lead frames 40 on the side opposite to the wiring substrate 10, further, the second electronic elements mounted on the lead frames 40 are electrically connected to the wiring substrate 10, the electronic elements 30, 31, and 34 can be arranged in a three-dimensional form.

Thus, according to this embodiment, in connecting the lead frames 40 and the wiring substrate 10 with each other, not only the strength of the connection can be made strong without causing an increase in the number of processes, but also the electronic elements 30, 31 and 34 can be arranged easily in a three-dimensional form, whereby it is possible to attain the reduction in size of the electronic device.

In this embodiment, moreover, since the lead frames 40 are directly connected to the wiring substrate 10, heat generated for example from the first electronic elements 30 and 31 mounted on the wiring substrate 10 can be radiated to the exterior through the lead frames 40.

Although in the example shown in FIGS. 3 to 5 the second electronic elements 34 mounted on the lead frames 40 and the wiring substrate 10 are electrically connected with each other through the bonding wires 35, the means for the electric connection is not limited to the bonding wires.

In the example shown in FIG. 3, the wiring substrate 10 is a laminate substrate of plural stacked layers 11 to 14 and the grooves 16 are formed by partial removal of the layer 14 positioned on the outer surface side out of the plural stacked layers 11 to 14.

However, as mentioned above, the wiring substrate 10 used in this embodiment may be a single-layer substrate. Also in this case, grooves can be formed by partially cutting or pressing the side end portions of the substrate.

Third Embodiment

Figure 7:
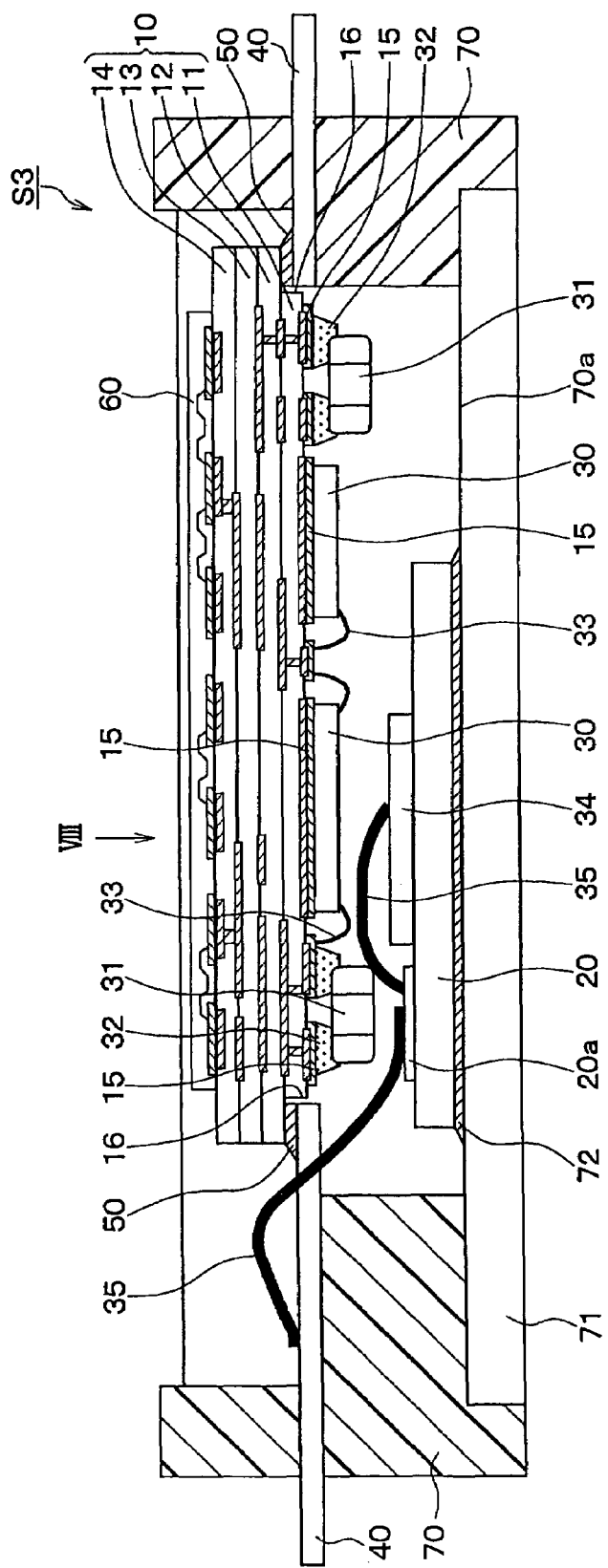
FIG. 7 is a cross sectional view showing an electronic device according to a third embodiment of the present invention.
Figure 8:
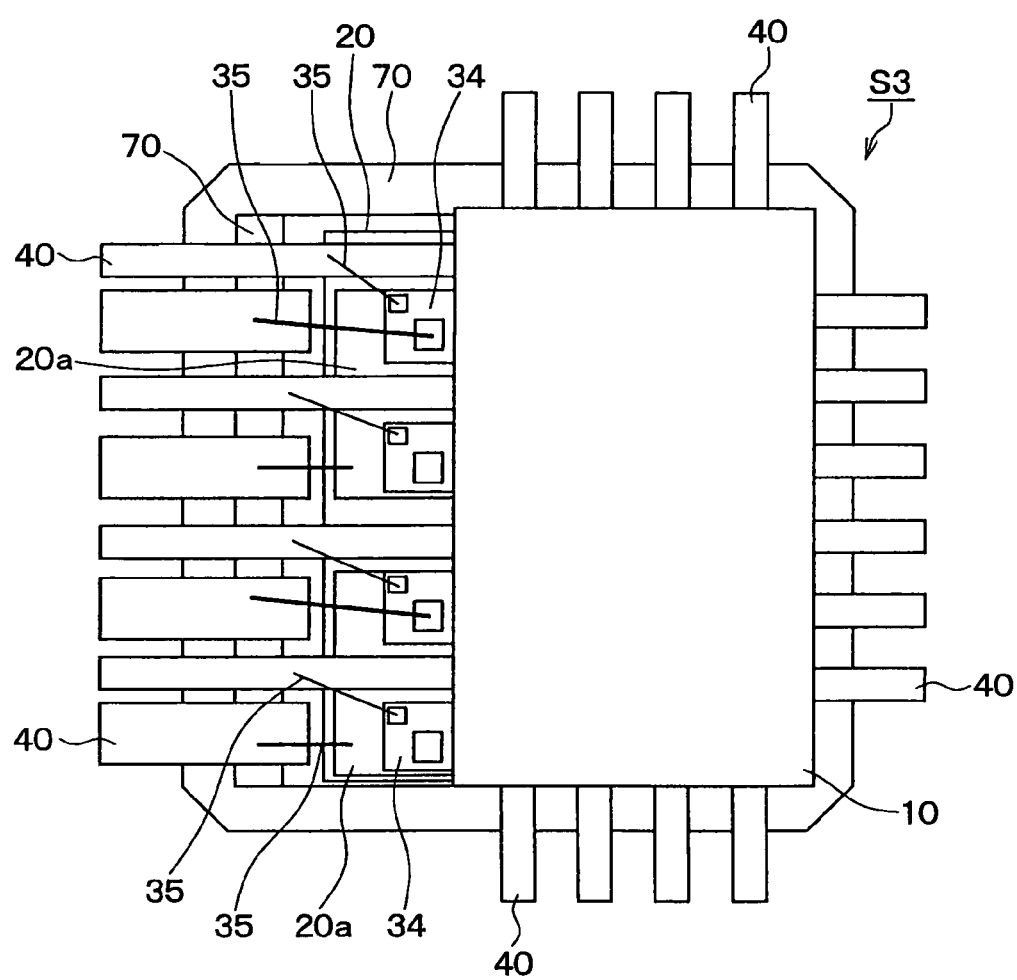
FIG. 8 is a plan view on arrow VIII in FIG. 7.

FIG. 7 is a diagram showing a schematic sectional construction of an electronic device S3 according to a third embodiment of the present invention and FIG. 8 is a schematic plan view of the electronic device S3 as seen in the direction of arrow VIII located at an upper position in FIG. 7.

[Construction, Etc.]

In the electronic device S3 of this embodiment, a first wiring substrate 10 is, for example, a ceramic substrate or a printed substrate and may be a single-layer substrate or a laminated substrate (multi-layer substrate). In this embodiment, a ceramic laminate substrate, which is generally known, is adopted as the first wiring substrate 10.

The first wiring substrate 10 as the ceramic laminate substrate is constructed by plural ceramic (e.g., alumina) layers 11, 12, 13, and 14. In FIG. 7, as to the first wiring substrate 10, the lower surface is a surface and the upper surface is a back surface.

In the example shown in FIG. 7, the first wiring substrate 10 comprises four ceramic layers 11 to 14, but the number of layers is not limited to four insofar as the number of layers is two or more. Of course, five or more layers will do.

Surface wiring 15 is formed on the surface of the first wiring substrate 10. Further, in FIGS. 7 and 8, inner-layer wiring 15b and back wiring 15c are formed respectively in the interior and the back surface of the first wiring substrate 10.

As shown in FIG. 7, first electronic elements 30 and 31 are mounted on the surface of the first wiring substrate 10. In this embodiment, active elements 30 such as semiconductor devices and passive elements 31 such as resistors and capacitors are mounted on the surface of the first wiring substrate 10.

The active elements 30 and the passive elements 31 are fixed onto the surface wiring 15 on the surface of the first wiring substrate 10 through a bonding material 32 such as silver paste or solder. The active elements 30 are electrically connected to the surface wiring 15 through bonding wires 33.

Mounting parts such as thick film resistors are mounted on the back surface of the first wiring substrate 10. A circuitry in the first wiring substrate 10 is constructed by all of the first electronic elements 30 and 31 mounted on the surface of the first wiring substrate 10, the mounting parts mounted on the back surface of the first wiring substrate, and such wirings as the surface wiring 15, inner-layer wiring 15b and back wiring 15c.

Lead frames 40 as lead terminals are connected through a conductive bonding material 50 to side end portions on the surface side of the first wiring substrate 10 with the first electronic elements 30 and 31 mounted thereon. The lead frames 40 are arranged in a plural number in the vertical direction of the paper surface in FIG. 7.

As shown in FIG. 7, grooves 16 are formed in side end portions of the back surface of the first wiring substrate 10 at positions corresponding to the positions for connection with the lead frames 40. Connecting end portions of the lead frames 40 for connection with the first wiring substrate 10 are fitted in the grooves 16 through the conductive bonding material 50, whereby the lead frames 40 are bonded to the first wiring substrate 10.

The grooves 16 are formed by partially removing the ceramic layer positioned on the surface side of the first wiring substrate 10 out of the plural ceramic layers 11 to 14. In the example shown in FIG. 7, the ceramic layer 11 positioned closest to the surface of the first wiring substrate 10 is partially removed from its side end portions to form cutout portions serving as the grooves 16.

In case of adopting such a construction using the grooves 16, for example, the wiring formed in the ceramic layer 12 as the second layer from the surface side of the wiring substrate 10 are exposed into the grooves 16, serving as connecting electrodes for connection with the lead frames 40. The wiring as the connecting electrodes and the lead frames 40 are connected together electrically and mechanically through the conductive bonding material 50.

The conductive bonding material 50 is not specially limited insofar as it can properly connect the lead frames 40 with the first wiring substrate electrically and mechanically. For example, there may be used solder, silver paste, a conductive adhesive comprising resin and a conductive filler such as metal contained in the resin, or a brazing filler metal.

As shown in FIG. 7, the lead frames 40 are supported by the case 70. The case 70 is a resin or ceramic case beforehand molded integrally with the lead frames 40. In this embodiment, the case 70 is a resin case and the lead frames 40 are united with the case 70 by insert molding and are supported thereby.

The case 70 has an opposed surface 70a opposed to the first wiring substrate 10. The case 70 is provided with a heat sink 71, which is fixed, for example by adhesive bonding, to the support portion of the case for supporting the lead frames 40. One surface of the heat sink 71 is constructed as the opposed surface 70a of the case 71.

A second wiring substrate 20 is provided on the opposed surface 70a of the case 70. The second wiring substrate 20 is fixed by bonding through a heat conductive bonding material 72 to the heat sink 71 as the opposed surface 70a.

The second wiring substrate 20 is also a ceramic substrate or a printed substrate and may be a single-layer substrate or a laminated substrate (multi-layer substrate). In this embodiment, a single-layer ceramic substrate, which is generally known, is adopted as the second wiring substrate 20.

Second electronic elements 34 are mounted on the second wiring substrate 20. As the second electronic elements 34 there may be adopted, for example, power devices through which a large current, such as MOSFETs or IGBTs (insulated gate bipolar transistors).

The first wiring substrate 10 and the second wiring substrate 20 are connected with each other electrically through the lead frames 40. In this embodiment, as shown in FIGS. 7 and 8, electrodes 20a of the second wiring substrate 20 and the lead frames 40 are electrically connected with each other through bonding wires 35.

In the electronic device S3 of this embodiment, as shown in FIGS. 7 and 8, the first wiring substrate 10, the connections between the first wiring substrate 10 and the lead frames 40, the first electronic elements 30 and 31 on the first wiring substrate 10, the second wiring substrate 20, the second electronic elements 34 on the second wiring substrate 20, and the bonding wires 35, are enclosed and sealed with a molding resin 60.

The electronic device S3 may also be mounted for example on an automobile and applied as a controller for an automobile motor. In this case, as shown in FIG. 6, the electronic device S3 may be constructed so as to include the control section K1 and the power section K2, the former being disposed on the first wiring substrate 10 side and the latter on the second wiring substrate 20 side.

FIG. 6 is also represented as a block diagram showing an example of a circuit system in the electronic device S3 of this embodiment, in which the control section K1 is constructed by a microcomputer and drive element comprising the first electronic elements 30 and 31, which are mounted on the first wiring substrate 10.

On the other hand, the power section K2 is an output circuit constructed by the second electronic elements 34 comprising power transistors which are mounted on the second wiring substrate 20, and is connected to the foregoing motor through terminals M+ and M−.

For example, the control section K1 receives a signal from an ECU mounted on an automobile and controls the power section K2 through the microcomputer and drive element, whereby the motor of the automobile is controlled.

[Manufacturing Method, Etc.]

A method for manufacturing the electronic device S3 of this embodiment will be described below with reference to FIGS. 9A to 9D and 10A, 10B. FIGS. 9A to 9D are process diagrams showing the manufacturing method and FIGS. 10A and 10B are process diagrams showing the manufacturing method and following the process diagrams of FIGS. 9A to 9D.

Figure 9A:
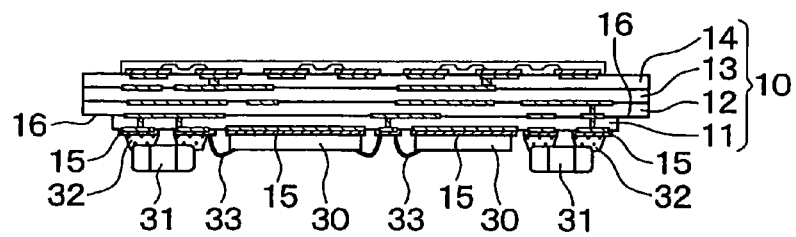
FIGS. 9A to 9D are cross sectional views explaining a method for manufacturing the device according to the third embodiment.
Figure 10A:
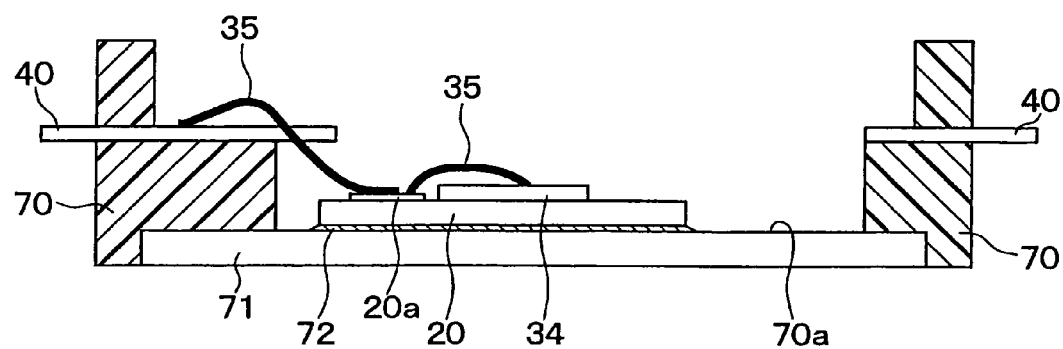
FIGS. 10A and 10B are cross sectional views explaining the method for manufacturing the device according to the third embodiment.
Figure 10B:
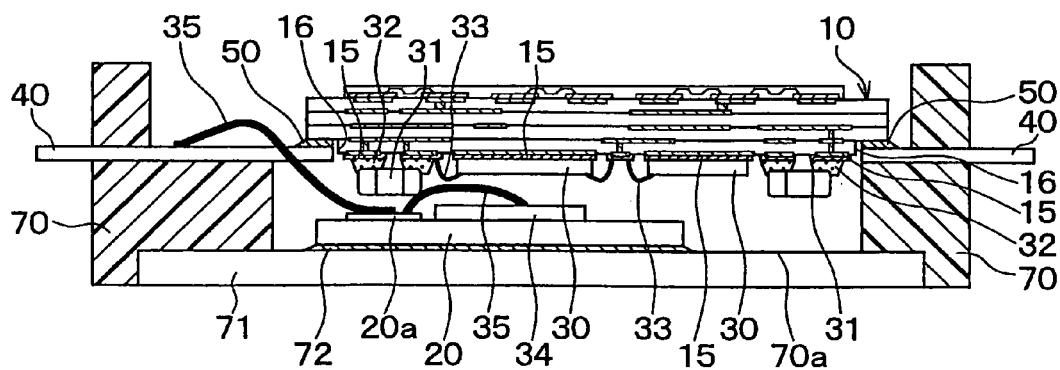

As shown in FIG. 9A, the foregoing via holes and conductor patterns serving as surface wiring 15, inner-layer wiring 15b and back wiring 15c are formed in green sheets serving as ceramic layers 11 to 14 in the first wiring substrate 10. How to form them may be a conventional method for forming a laminate substrate.

Then, for forming cutout portions serving as grooves 16, the ceramic layer 11 positioned on the surface side of the first wiring substrate 10 is partially removed. In FIG. 9A, correspondingly to the example shown in FIG. 7, side end portions of one layer 11 positioned closest to the surface of the first wiring substrate are partially cut off by means of a laser or a punch.

Next, the green sheets are stacked and the resulting laminate is baked, whereby grooves 16 are formed in side end portions on the surface side of the first wiring substrate 10.

In the first wiring substrate 10, where required, a plating treatment is applied to the surface and back wirings in order to ensure a high moutability of IC, etc., or thick film resistors for example are formed on the back surface by printing and baking. Further, if necessary, protection glass is formed, or laser trimming is performed for adjusting a resistance value.

The cutting for the green sheets may be done up to a desired layer according to a required depth of the grooves 16. For example, it may be done for only the first layer from the surface side or up to the third layer.

Then, first electronic elements 30 and 31 are mounted on the surface of the first wiring substrate 10. In this process of mounting the first electronic elements 30 and 31, the first electronic elements 30 and 31 as the active and passive elements respectively are mounted and fixed onto the surface of the first wiring substrate 10 through a bonding material 32, and bonding wires 33 are formed on the active elements 30 by wire bonding to connect the active elements and the wiring substrate 10 electrically with each other. The state so far obtained is shown in FIG. 9A.

Figure 9B:
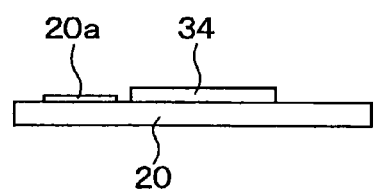

On the other hand, as shown in FIG. 9B, second electronic elements 34 are mounted on the second wiring substrate 20. Also in this process of mounting the second electronic elements 34, the second electronic elements 34 are mounted and fixed through a bonding material such as silver paste or solder onto the surface of the second wiring substrate 20.

Figure 9C:
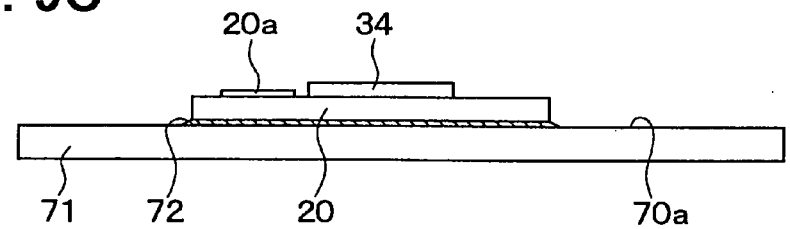

Then, as shown in FIG. 9C, the second wiring substrate 20 with the second electronic elements 34 mounted thereon is mounted and fixed by bonding through a heat conducting bonding material 72 onto the surface of the heat sink 71 serving as the opposed surface 70a of the case 70.

Figure 9D:
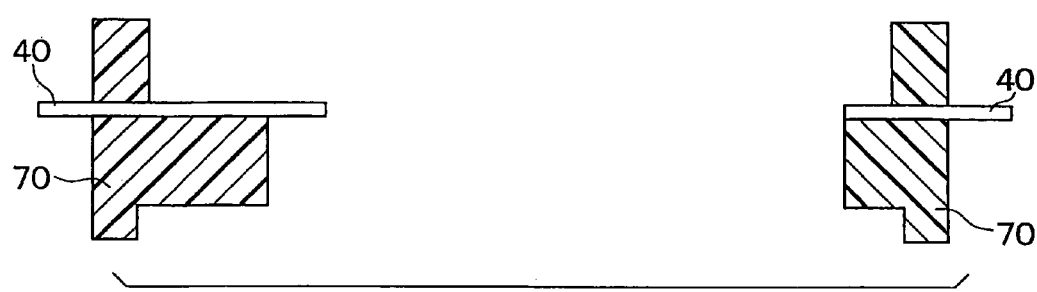

On the other hand, as shown in FIG. 9D, lead frames 40 are formed in the case 70 by insert molding.

Then, as shown in FIG. 10A, the heat sink 70 is fixed to and united with the case 70 which supports the lead frames 40, through an adhesive or the like. Subsequently, wire bonding is performed to provide an electric connection between the electrodes 20a on the second wiring substrate 20 and the lead frames 40 through bonding wires 35.

Next, as shown in FIG. 10B, the first wiring substrate 10 and the lead frames 40 are connected with each other.

First, a conductive bonding material 50 is disposed within the grooves 16 of the first wiring substrate 10. The conductive bonding material 50 may be disposed on the lead frame 40 side. How to dispose the conductive bonding material 50 is not specially limited. For example, printing or dispensing may be adopted.

In case of disposing the conductive bonding material 50 by printing, it is preferable that the conductive bonding material 50 be disposed on the lead frame 40 side. The reason is that, when printing is performed onto the wiring substrate 10 having such depressions as the grooves 16, there sometimes is a case where the conductive bonding material 50 does not smoothly get into the grooves 16.

Then, connecting end portions of the lead frames 40 for connection with the wiring substrate 10 are fitted into the grooves through the conductive bonding material 50. Thereafter, the conductive bonding material 50 is cured, whereby the first wiring substrate 10 and the lead frames 40 are connected together electrically and mechanically.

Subsequently, a resin sealing process is carried out, whereby the first wiring substrate 10, the connections between the first wiring substrate 10 and the lead frames 40, the first electronic elements 30 and 31 on the first wiring substrate 10, the second wiring substrate 20, the second electronic elements 34 on the second wiring substrate 20, and the bonding wires 35, are sealed with a molding resin 60. In this way the electronic device S3 is fabricated.

[Effect, Etc.]

According to this embodiment there is provided the electronic device S3, which is characterized by the following points.

The electronic device S3 is provided with the first wiring substrate 10 with the first electronic elements 30 and 31 mounted thereon and the lead frames 40 connected to the first wiring substrate 10 through the conductive bonding material 50.

The grooves 16 are formed in the side end portions of the first wiring substrate 10 at positions corresponding to the connections between the wiring substrate and the lead frames 40, and the connecting end portions of the lead frames 40 for connection with the first wiring substrate 10 are fitted in the grooves 16 through the conductive bonding material 50, whereby the first wiring substrate 10 and the lead frames 40 are connected with each other.

The lead frames 40 are supported by the case 70, the case 70 has the opposed surface 70a opposed to the first wiring substrate 10, and the second wiring substrate 20 is provided on the opposed surface 70a of the case 70.

The second electronic elements 34 are mounted on the second wiring substrate 20, and the first and second wiring substrates 10, 20 are electrically connected with each other through the lead frames 40.

According to the electronic device S3 characterized by the above points, since the lead frames 40 are connected to the first wiring substrate 10 by being fitted into the grooves 16, the connection between the first wiring substrate 10 and the lead frames 40 can be made stronger than in the prior art.

As shown in the above manufacturing method, the grooves 16 can be formed simultaneously with fabrication of the first wiring substrate 10, so that an increase in the number of processes does not occur in connecting the lead frames 40 to the first wiring substrate 10.

Since the first electronic elements 30, 31 and the second electronic elements 34 are mounted respectively on the first wiring substrate 10 and the second wiring substrate 20 provided on the opposed surface 70a of the case 70 which is opposed to the first wiring substrate 10, and since the second wiring substrate 20 is connected to the first wiring substrate 10 electrically through the lead frames 40, the electronic elements 30, 31, and 34 can be arranged in a three-dimensional form.

Thus, according to this embodiment, in connecting the lead frames 40 and the wiring substrates 10, 20 with each other, not only the connection can be made strong without causing an increase in the number of processes, but also the electronic elements 30, 31, and 34 can be arranged easily in a three-dimensional form, whereby it is possible to attain the reduction in size of the electronic device.

In this embodiment, moreover, since the lead frames 40 are directly connected to the first wiring substrate 10, heat generated for example from the first electronic elements 30 and 31 mounted on the first wiring substrate 10 can be radiated to the exterior through the lead frames 40.

In the above illustrated example, since the case 70 is provided with the heat sink 71 and one surface of the heat sink 71 is constructed as the opposed surface 70a of the case 70, it is possible to improve the heat dissipating property of the second wiring substrate 20 which is provided on the opposed surface 70a of the case 70.

Although in the above illustrated example the second wiring substrate 20 and the lead frames 40 are electrically connected together through the bonding wires 35, the means for such an electric connection is not limited to the bonding wires.

In the above illustrated example the first wiring substrate 10 is a laminate substrate of plural stacked layers 11 to 14 and the grooves 16 are formed by partially removing the layer 14 positioned on the outer surface side out of the plural stacked layers 11 to 14.

However, as mentioned earlier, the first wiring substrate 10 used in this embodiment may be a single-layer substrate. Also in this case, the grooves can be formed by partially cutting or pressing the side end portions of the substrate.

Fourth Embodiment

Figure 11:
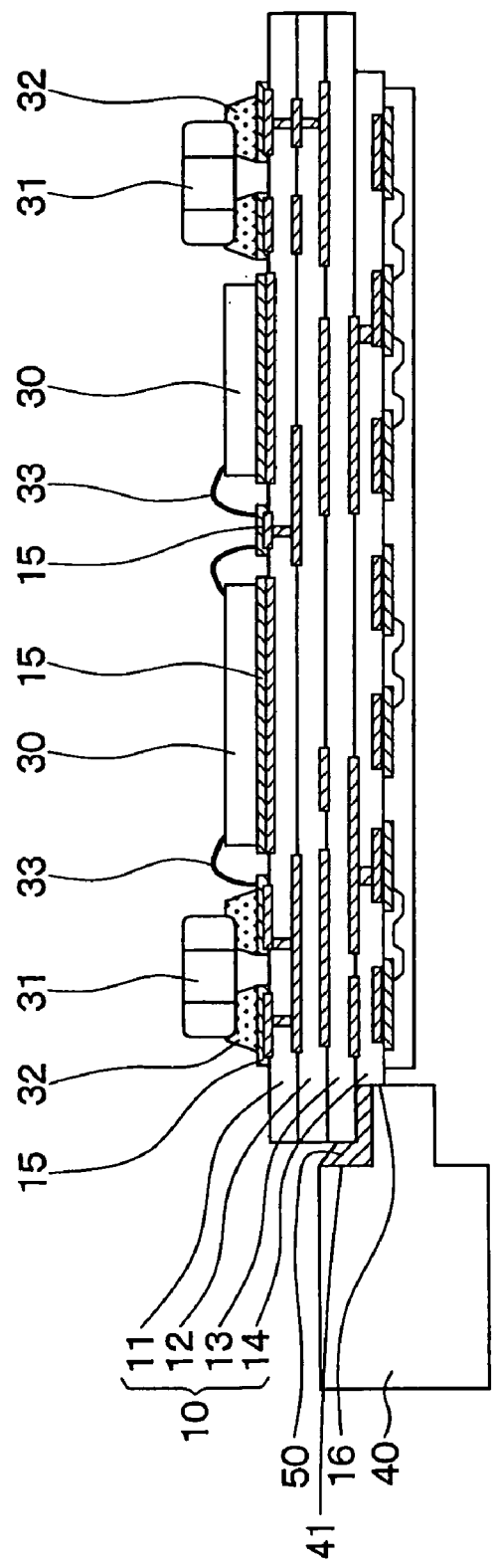
FIG. 11 is a partial cross sectional view showing an electronic device according to a fourth embodiment of the present invention.

FIG. 11 is a diagram showing a schematic sectional construction of a principal portion of an electronic device according to a fourth embodiment of the present invention.

In the above embodiments the grooves 16 are formed in the side end portions of the wiring substrate 10 (20) at positions corresponding to the connecting portions for connection with the lead frames 40, and the wiring substrate 10 (20) and the lead frames 40 are connected together by fitting the connecting end portions of the lead frames 40 into the grooves 16 through the conductive bonding material 50.

In this embodiment, as shown in FIG. 11, not only the grooves 16 are formed in the wiring substrate 10, but also grooves 41 are formed in the connecting end portions of the lead frames 40, and the grooves 16 of the wiring substrate 10 and the grooves 41 of the lead frames 40 are engaged with each other through the conductive bonding material 50, whereby the substrate 10 and the lead frames 40 are connected with each other.

This embodiment is applicable to any wiring substrate insofar as the wiring substrate used is connected to the lead frames 40, such as the wiring substrates 10 and 20 described in the first embodiment, the wiring substrate 10 described in the second embodiment, and the first wiring substrate 10 described in the third embodiment.

As result, when connecting the lead frames 40 to the wiring substrate 10, it is possible to improve the positioning performance and bonding strength of the two.

Fifth Embodiment

Figure 12:
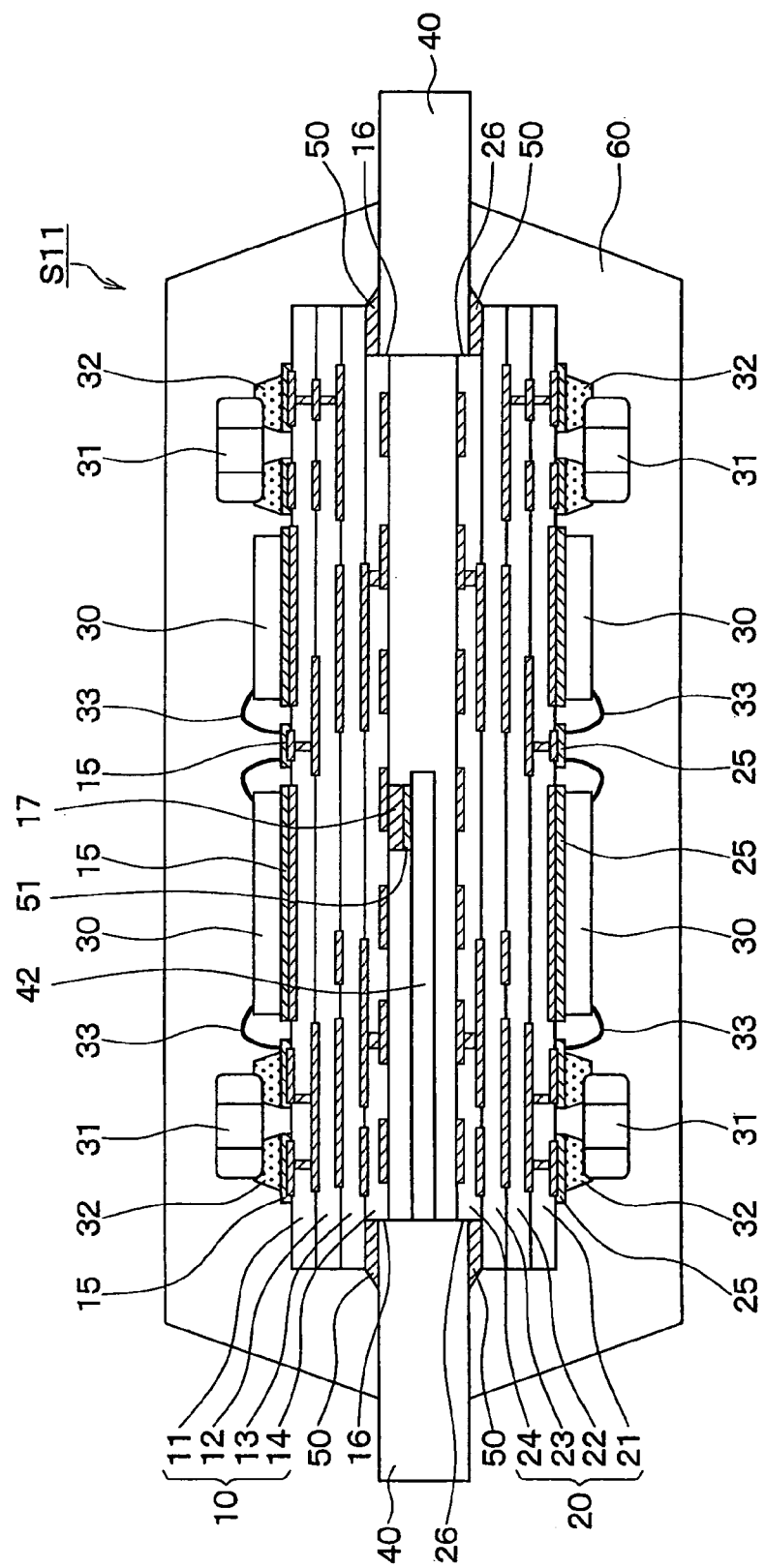
FIG. 12 is a cross sectional view showing an electronic device according to a fifth embodiment of the present invention.

FIG. 12 is a diagram showing a schematic sectional construction of an electronic device S11 according to a fifth embodiment of the present invention. The electronic device S11 of this embodiment corresponds to a partial modification of the electronic device S1 of the first embodiment. A description will be given below mainly about a different point between the two.

In the electronic device S11, terminals 17 are provided on the back surface(s) of one or both of the first and second wiring substrates 10, 20, i.e., on the surface(s) for connection with the lead frames 40, lead frames 40 are partially extended as extending portions 42 up to the terminals 17, and the extending portions 42 and the terminals 17 are electrically connected with each other.

In the example shown in FIG. 12, terminals 17 are provided on the connection surface of the first wiring substrate 10 for connection with the lead frames 40, and the extending portions 42 of lead frames 40 and the terminals 17 are electrically connected with each other through a conductive bonding material 51.

The terminals 17 are electrically connected to the surface wirings 15 and 25 through the inner-layer wiring 15b, 25b and back wiring 15c, 25c formed on the wiring substrates 10 and 20 to constitute a circuit. It is apparent that the same construction can be adopted also for the second wiring substrate 20.

According to this embodiment, the wiring resistance between the wiring substrates 10, 20 and the lead frames 40 can be made low and the connectability between the two can be improved. When the potential of the terminals 17 is set at GND potential, the resistance to noise improved, and when the terminals 17 are made large current wiring, it is possible to suppress a lowering of voltage and the generation of heat in the wiring. Besides, circuit characteristics can be improved.

Sixth Embodiment

Figure 13:
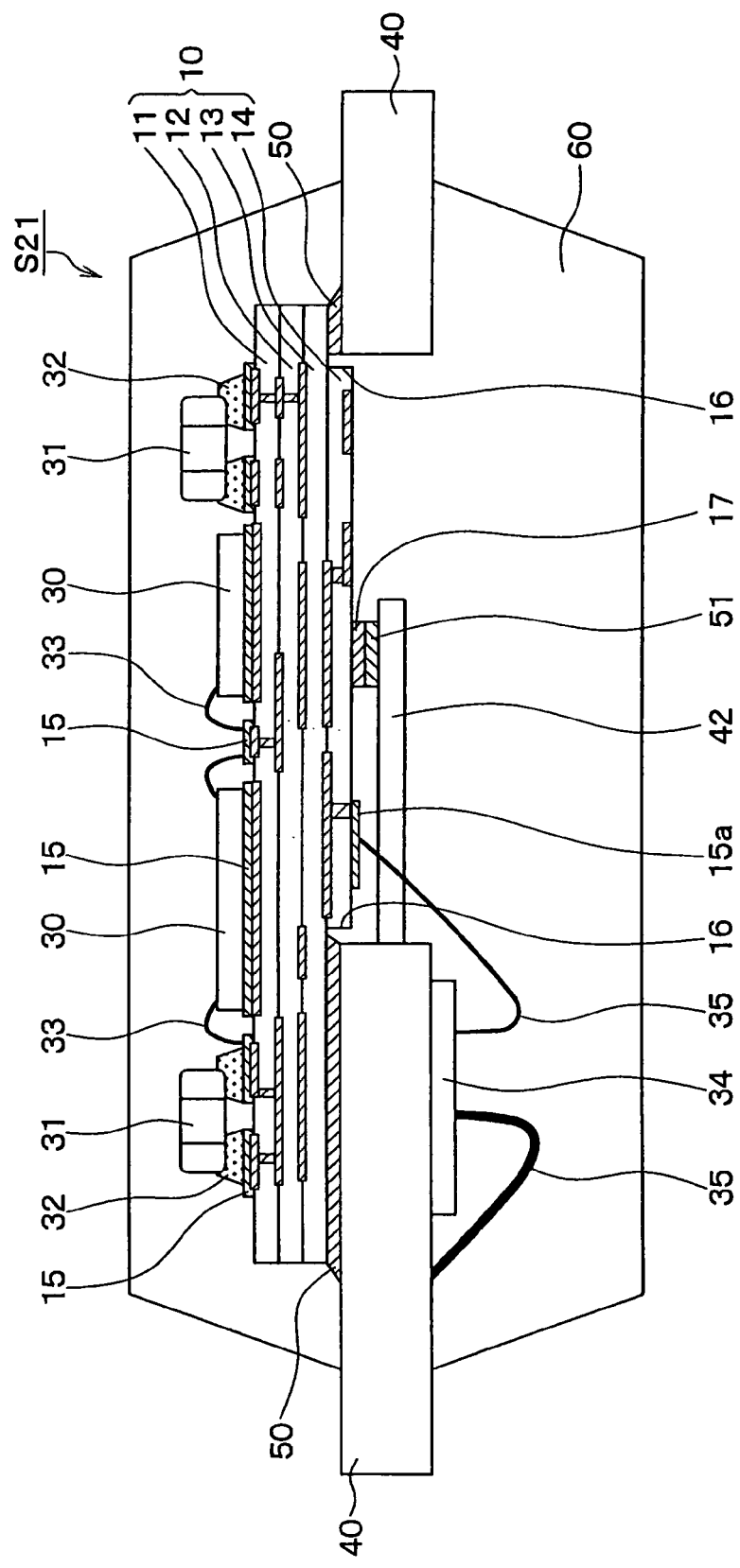
FIG. 13 is a cross sectional view showing an electronic device according to a sixth embodiment of the present invention.

FIG. 13 is a diagram showing a schematic sectional construction of an electronic device S21 according to a sixth embodiment of the present invention. The electronic device S21 of this embodiment corresponds to a partial modification of the electronic device S2 of the second embodiment. A description will be given below mainly about a different point between the two.

The electronic device S21 of this embodiment corresponds to the application of the fifth embodiment to the second embodiment. More specifically, in the electronic device S21 of this embodiment, terminals 17 are provided on the back surface of the wiring substrate 10, i.e., on the connection surface of the wiring substrate 10 for connection with the lead frames 40, lead frames 40 are partially extended as extending portions 42 up to the terminals 17, and the extending portions 42 and the terminals 17 are electrically connected with each other.

In the example shown in FIG. 13, terminals 17 are provided on the connection surface of the wiring substrate 10 for connection with the lead frames 40, and the extending portions 42 of lead frames 40 and the terminals 17 are electrically connected with each other through a conductive bonding material 51.

The terminals 17 are electrically connected to the surface wirings 15 and 25 through the inner-layer wiring 15b, 25b and back wiring 15c, 25c formed on the wiring substrate 10 to constitute a circuit.

Also according to this embodiment, the wiring resistance between the wiring substrate 10 and the lead frames 40 can be made low and the connectability between the two can be improved. Besides, the resistance to noise is improved by setting the potential of the terminals at GND potential. Moreover, by making the terminals 17 a large current wiring, it is possible to suppress a lowering of voltage and the generation of heat in the wiring. Further, circuit characteristics can be improved.

It is apparent that the construction of the lead frames 40 having the extending portions 42 is applicable also to the electronic device S3 of the third embodiment shown in FIG. 7.

Figure 17:
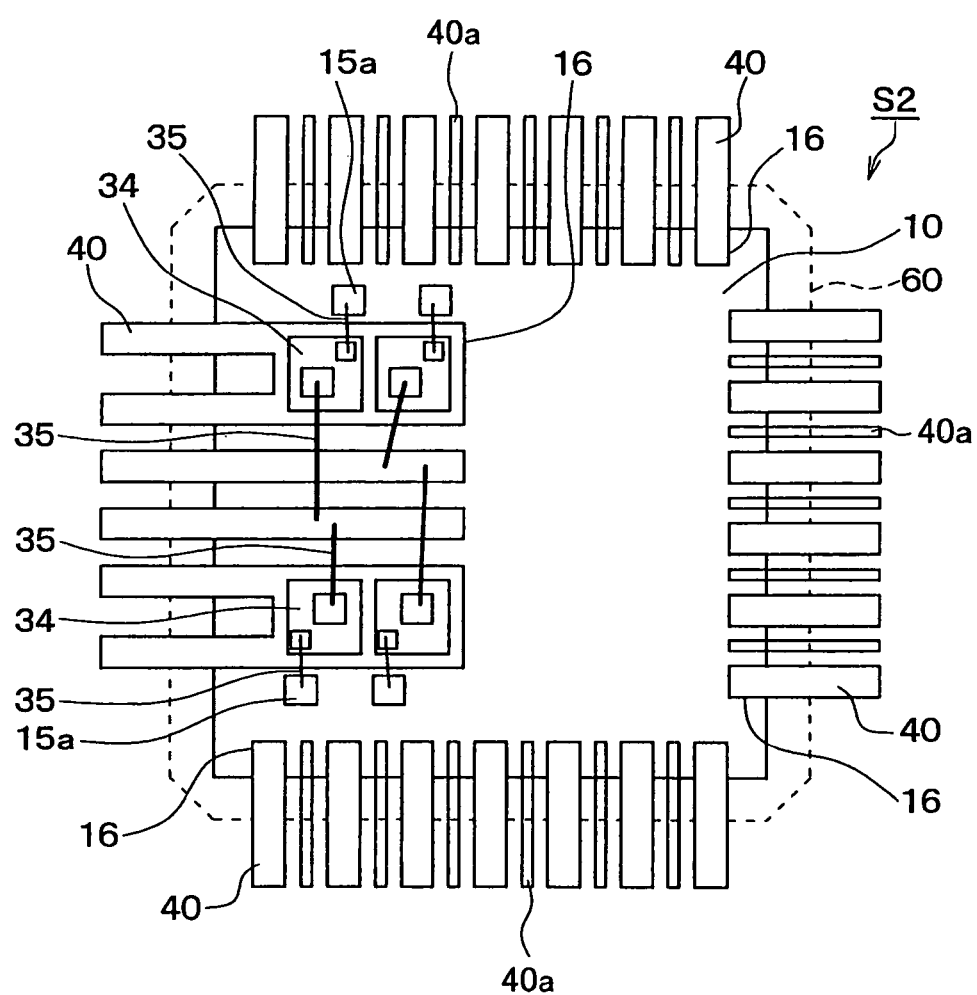
FIG. 17 is a plan view showing an electronic device according to a ninth embodiment of the present invention.

For example, the same terminals 17 as above may be provided on the connection surface of the first wiring substrate 10 for connection with the lead frames 40 at positions avoiding various electronic elements in FIG. 17, the same extending portions 42 as above extending up to the terminals 17 may be formed on lead frames 40, and the extending portions 42 and the terminals 17 may be electrically connected with each other.

Seventh Embodiment

FIG. 14 is a diagram showing a schematic sectional construction of an electronic device S12 according to a seventh embodiment of the present invention. The electronic device S12 of this embodiment corresponds to a partial modification of the electronic device S1 of the first embodiment. A description will be given below mainly about a different point between the two.

In the electronic device S12 of this embodiment, a heat dissipating plate 43 connected thermally to the first and second wiring substrates 10, 20 is interposed between both wiring substrates 10 and 20, and heat generated from both wiring substrates 10, 20 can be dissipated through the heat dissipating plate 43.

More specifically, in the example shown in FIG. 14, the heat dissipating plate 43 such as a Cu plate is connected to both wiring substrates 10 and 20 through a heat conducting bonding material 53, e.g., solder or a resin adhesive.

The provision of the heat dissipating plate 43 is preferred because the heat dissipating performance of both wiring substrates 10 and 20 can be improved.

In the example shown in FIG. 14, substantially the whole of the device is sealed with a molding resin 60, but it is preferable that a part of the heat dissipating plate 43 be exposed from the molding resin 60 or connected thermally to an external heat dissipating member.

Figure 15A:
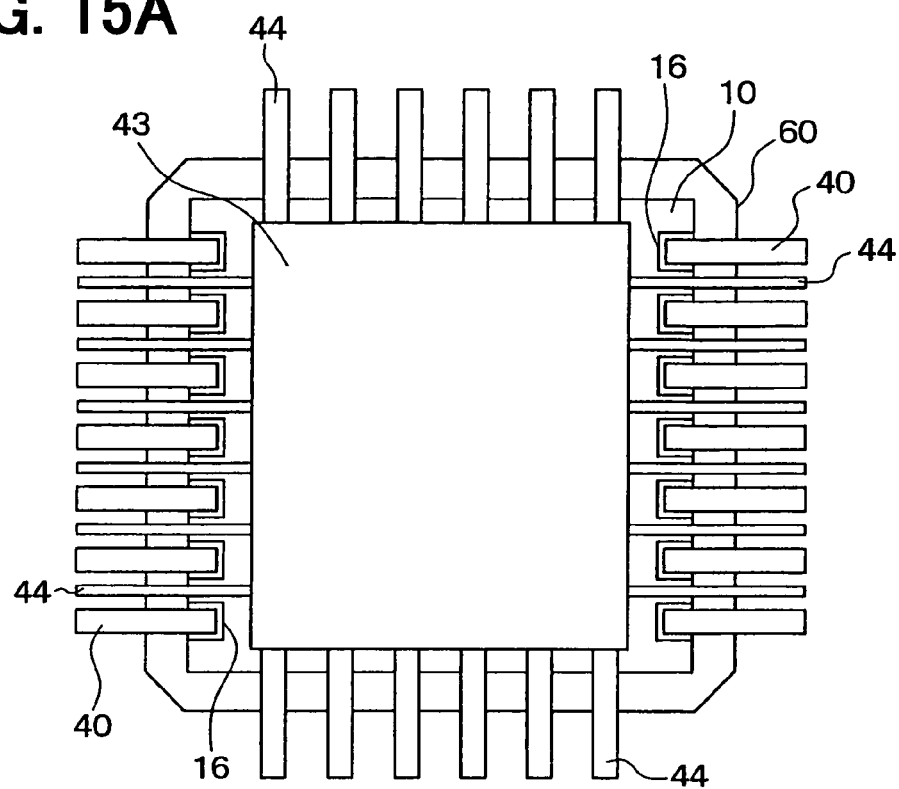
FIGS. 15A and 15B are plan views showing the device according to the seventh embodiment.
Figure 15B:
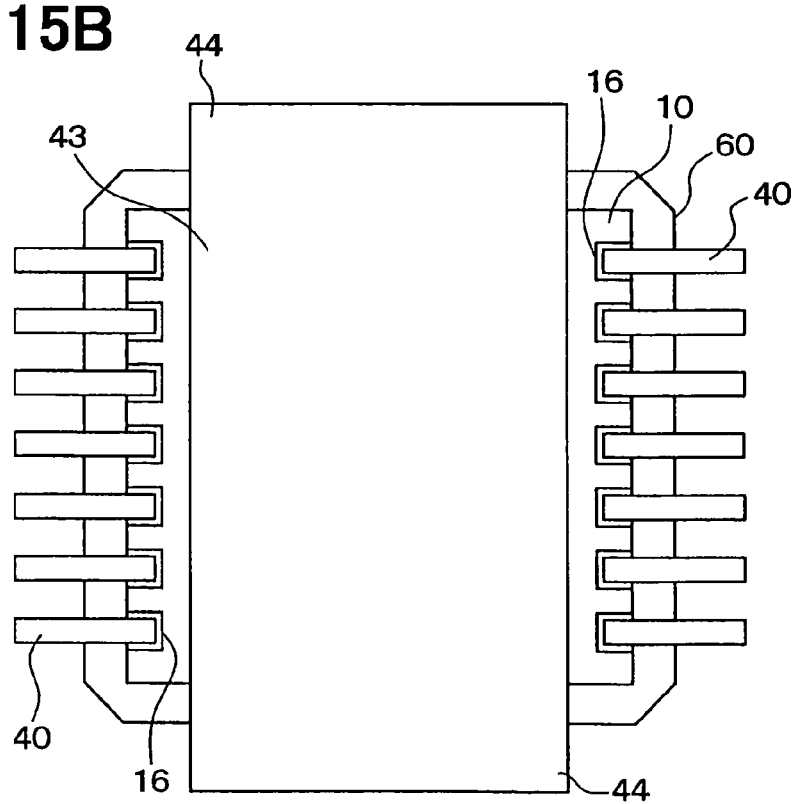

FIGS. 15A and 15B are plan views showing examples of an exposed form of the heat dissipating plate 43 from the molding resin 60.

In the example shown in FIG. 15A, the heat dissipating plate 43 has comb teeth-like projecting portions 44 projecting from the molding resin 60. The projecting portions 44 may be formed by molding integrally with a rectangular body of the heat dissipating plate 44 or may be bonded to the body by caulking or welding. Heat generated from the heat dissipating plate 43 is allowed to escape from the projecting portions 44 to the exterior of the molding resin 60.

The projecting portions 44 are provided on the four sides of the rectangular heat dissipating plate 43. On the sides where the lead frames 40 are present, the projecting portions 44 are each provided between adjacent lead frames 40.

In the example shown in FIG. 15B, a rectangular heat dissipating plate 43 is larger in size so as to project from the molding resin 60 on two sides where the lead frames 40 are not present. Also in this case, heat is allowed to escape from the projecting portions to the exterior of the molding resin 60.

Eighth Embodiment

Figure 16:
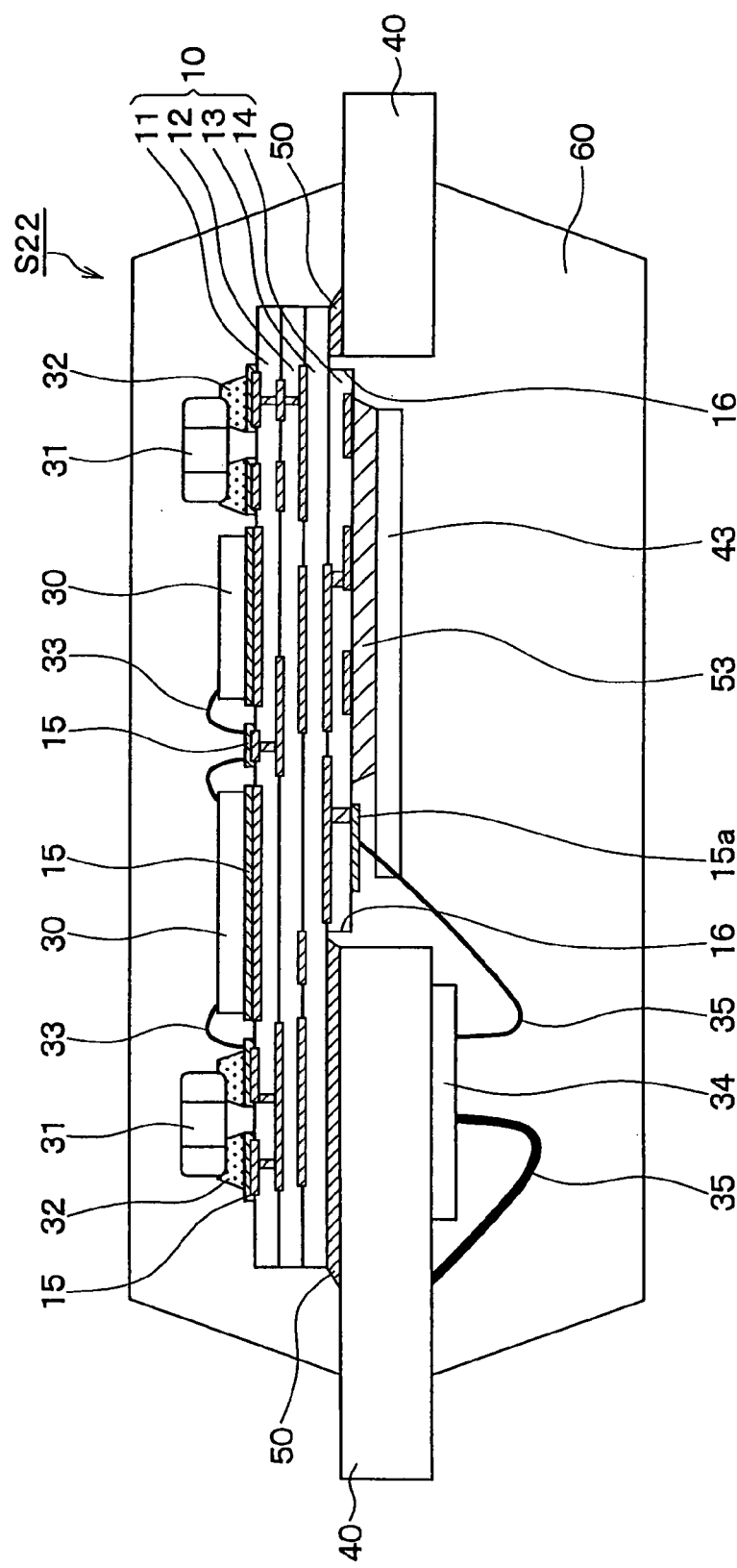
FIG. 16 is a cross sectional view showing an electronic device according to an eighth embodiment of the present invention.

FIG. 16 is a diagram showing a schematic sectional construction of an electronic device S22 according to an eighth embodiment of the present invention. The electronic device S22 of this embodiment corresponds to a partial modification of the electronic device S1 of the first embodiment. A description will be given below mainly about a different point between the two.

The electronic device S22 of this embodiment corresponds to the application of the seventh embodiment to the second embodiment. More specifically, in the electronic device S22 of this embodiment, a heat dissipating plate 43 connected thermally to the wiring substrate 10 is disposed on the back surface of the wiring substrate 10, i.e., on the connection surface of the wiring substrate 10 for connection with the lead frames 40, and heat from the wiring substrate 10 can be dissipated through the heat dissipating plate 43.

In the example shown in FIG. 16, the heat dissipating plate 43 such as a Cu plate is connected to the wiring substrate 10 through a heat conducting bonding material 53, e.g., solder or a resin adhesive.

This construction is preferred because the heat dissipating performance of the wiring substrate 10 can be improved by the heat dissipating plate 43.

In the example shown in FIG. 16, substantially the whole of the device is sealed with a molding resin 60, but it is preferable that a part of the heat dissipating plate 43 be exposed from the molding resin 60 or connected thermally to an external heat dissipating member. This mode may be the same as that of the example shown in FIGS. 15A and 15B.

Ninth Embodiment

FIG. 17 is a diagram showing a schematic sectional construction of a principal portion of an electronic device according to a ninth embodiment of the present invention. The construction shown in FIG. 17 corresponds to a partial modification of the electronic device S2 of the second embodiment shown in FIG. 4, but this embodiment is applicable also to the electronic device of the first embodiment.

In the first and second embodiments, connecting end portions of the lead frames 40 for connection with the wiring substrates 10 and 20 are fitted into the grooves 16 and 26 through the conductive bonding material 50, whereby the wiring substrates 10, 20 and the lead frames 40 are connected together.

As in this embodiment shown in FIG. 17, portions free of the grooves 16 may be provided in the wiring substrate 10 and lead frames 40a may be electrically connected to the grooves-free portions through a conductive bonding material 50 for example.

According to this construction, the lead frames 40a can be connected to the wiring substrates 10 and 20 even at such portions as cannot be grooved.

Tenth Embodiment

Figure 18:
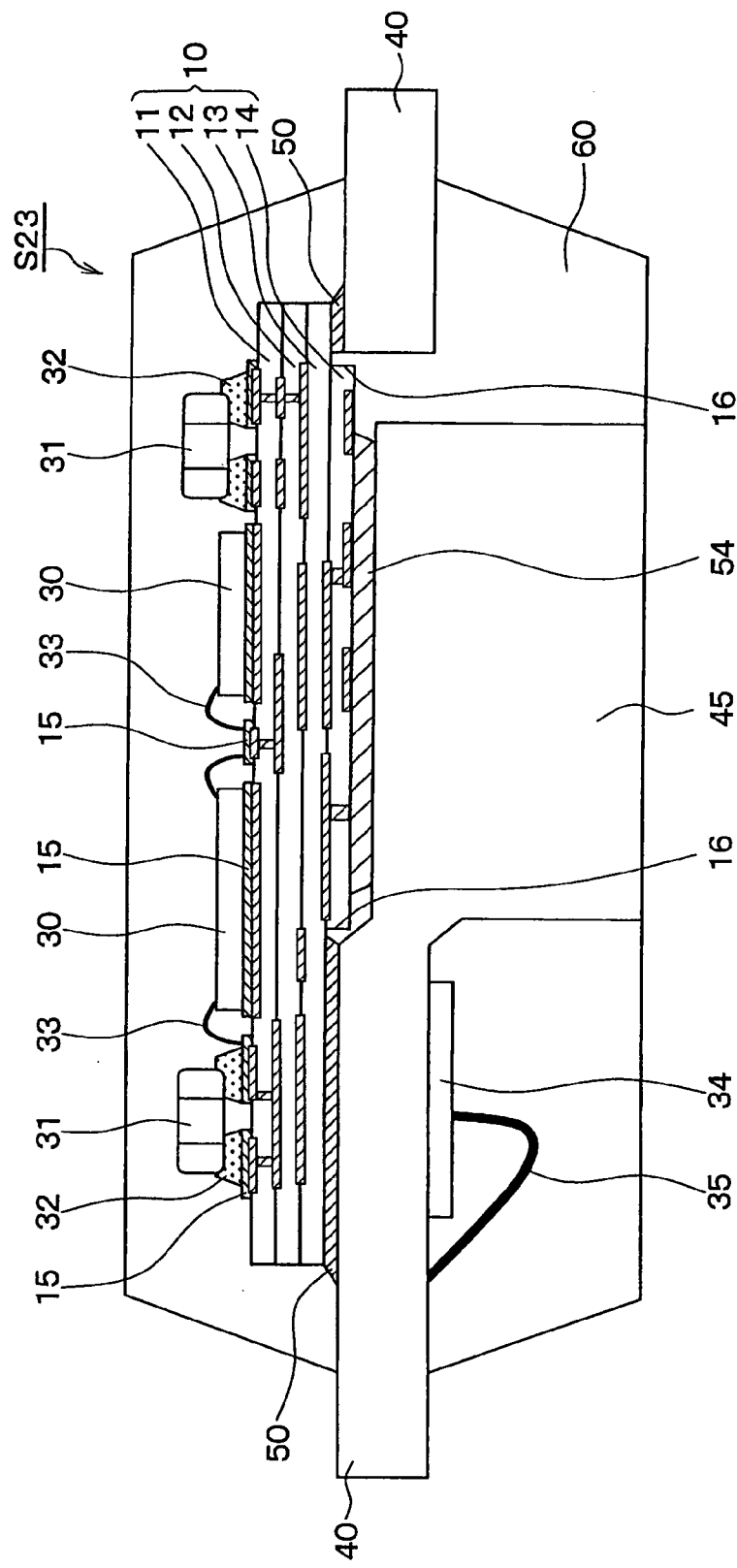
FIG. 18 is a cross sectional view showing an electronic device according to a tenth embodiment of the present invention.

FIG. 18 is a diagram showing a schematic sectional construction of an electronic device S23 according to a tenth embodiment of the present invention. The electronic device S23 of this embodiment corresponds to a partial modification of the electronic device S2 of the second embodiment.

In the electronic device S23 of this embodiment, a heat sink 45 is provided on the connection surface side of the wiring substrate 10 for connection with the lead frames 40, and the lead frames 40 are thermally connected to the heat sink 45. Further, the first electronic elements 30, 31, the wiring substrate 10, the second electronic elements 34, the lead frames 40, and the heat sink 45, are sealed with the molding resin 60 so that the heat sink 45 and the lead frames 40 are partially exposed.

In the example shown in FIG. 18, the lead frames 40 and the heat sink 45 are formed integrally by molding and are thereby connected together thermally. Of course, the lead frames 40 and the heat sink 45 may be formed separately and connected together thermally by, for example, caulking or welding.

The heat sink 45 and the wiring substrate 10 are thermally connected together through an adhesive 54 and heat generated from the wiring substrate 10 escapes through the heat sink 45. In this embodiment, the second electronic elements 34 and the wiring substrate 10 can be connected together electrically by wire bonding at positions not shown.

According to this embodiment, the heat dissipating performance of the device S23 can be ensured properly in case of the device being a resin-sealed type electronic device. This is preferable.

Other Embodiments

Although in the above embodiments the wiring substrates 10 and 20 are mainly constructed by laminate substrates, the wiring substrates 10 and 20 may be thick film substrates or printed resin substrates. Further, in the embodiments using plural wiring substrates, different types of substrates such as laminates substrate, thick film substrate, and printed resin substrate, may be combined as the wiring substrates.

Such changes and modifications are to be understood as being within the scope of the present invention as defined by the appended claims.

What is claimed is:

1. An electronic device comprising:
   a first substrate and a second substrate;
   a lead frame disposed between the first and the second substrates for electrically connecting therebetween; and
   a first groove and a second groove disposed on the first and the second substrates, respectively, wherein
   the first and the second grooves correspond to a connection portion between the first and the second substrates and the lead frame, and
   the lead frame is connected to the first and the second substrates in such a manner that one end of the lead frame is engaged in both of the first and the second grooves through a conductive bonding material.

2. The device according to claim 1, wherein
   the first and the second substrates are laminated substrates having a plurality of layers,
   one of the layers in the first substrate is shorter than the other layers so that the first grooves is provided, the one being disposed utmost outside of the first substrate, and
   one of the layers in the second substrate is shorter than the other layers so that the second grooves is provided, the one being disposed utmost outside of the second substrate.

3. The device according to claim 1, wherein
   the first and the second substrates are laminated substrates having a plurality of layers,
   one of the layers in the first substrate has a concavity so that the first grooves is provided, the one being disposed utmost outside of the first substrate, and
   one of the layers in the second substrate has a concavity so that the second grooves is provided, the one being disposed utmost outside of the second substrate.

4. The device according to claim 1, wherein
   at least one of the first and the second substrates includes a terminal, and
   the one end of the lead frame includes an extension portion extending to the terminal of the first or the second substrate so that the extension portion electrically connects to the terminal.

5. The device according to claim 1, further comprising:
   a heat radiation plate disposed between the first and the second substrates for radiating heat generated in the first and the second substrates.

* * * * *